(12) United States Patent
Kim et al.

(10) Patent No.: US 11,659,750 B2
(45) Date of Patent: May 23, 2023

(54) TILED DISPLAY

(71) Applicant: Samsung Display Co., Ltd., Yongin-si (KR)

(72) Inventors: Kwi Hyun Kim, Seongnam-si (KR); Sang Yong No, Seoul (KR); Tae Ho Kang, Siheung-si (KR); Hwa Rang Lee, Suwon-si (KR); Joon Hoo Choi, Seoul (KR); Ji Yeon Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/445,807

(22) Filed: Aug. 24, 2021

(65) Prior Publication Data
US 2022/0102476 A1 Mar. 31, 2022

(30) Foreign Application Priority Data
Sep. 25, 2020 (KR) .......................... 10-2020-0124427

(51) Int. Cl.
*H01L 33/50* (2010.01)
*H01L 27/32* (2006.01)

(52) U.S. Cl.
CPC ...... *H01L 27/3293* (2013.01); *H01L 27/3262* (2013.01); *H01L 27/3276* (2013.01); *H01L 33/50* (2013.01)

(58) Field of Classification Search
CPC .............. G09G 9/3026; G02F 1/13336; H01L 27/3293
See application file for complete search history.

(56) References Cited

U.S. PATENT DOCUMENTS

| | | | | |
|---|---|---|---|---|
| 2018/0190631 A1* | 7/2018 | Kim | .................... | H01L 27/3276 |
| 2020/0388636 A1* | 12/2020 | Yueh | ................... | G02F 1/13336 |
| 2021/0134920 A1* | 5/2021 | Yamazaki | ................ | G09G 3/32 |

FOREIGN PATENT DOCUMENTS

| | | | |
|---|---|---|---|
| KR | 10-0740906 B1 | 7/2007 | |
| KR | 10-1895217 B1 | 9/2018 | |
| KR | 10-1895522 B1 | 10/2018 | |

* cited by examiner

*Primary Examiner* — Kevin M Nguyen
(74) *Attorney, Agent, or Firm* — Lewis Roca Rothgerber Christie LLP

(57) ABSTRACT

Provided is a tiled display. The tiled display includes: a first display device including a first display area including pixels, a second display device including a second display area including pixels adjacent to the first display area, and a seam between the first display area and the second display area. Each of the first display device and the second display device includes: a first base part supporting a respective one of the first display device and the second display device, a thin-film transistor layer on the first base part, the thin-film transistor layer including thin-film transistors included in the pixels and including connection lines in the seam, and bridge electrodes in the seam to couple between the connection lines of the first display device and the second display device.

20 Claims, 12 Drawing Sheets

TILED DISPLAY

CROSS-REFERENCE TO RELATED APPLICATION

This application claims priority to and the benefit of Korean Patent Application No. 10-2020-0124427 filed on Sep. 25, 2020, in the Korean Intellectual Property Office, the entire content of which is hereby incorporated by reference.

BACKGROUND

1. Field

Embodiments of the present disclosure relate to a tiled display.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device includes a light-emitting element that can emit light on its own, so that each of the pixels of the display panel can emit light by themselves. Accordingly, a light-emitting display device can display images without a backlight unit that supplies light to the display panel.

For a display device having a large screen, a relatively large number of pixels are included, and thus, the defect rate of light emitting elements may increase while productivity and/or reliability may deteriorate. To overcome such issues, a tiled display can provide a large screen by coupling a plurality of display devices having a relatively small size. Such a tiled display may include boundaries between the plurality of display devices which are referred to as seams because there are non-display areas and/or bezel areas between the plurality of display devices adjacent to each other. When a single image is displayed on the full screen, such boundaries between the display devices result in visible seams, hindering a viewer from being immersed into the image.

SUMMARY

Aspects of embodiments of the present disclosure provide a tiled display that can improve the issue of visible seams between a plurality of display devices by way of preventing the boundaries or non-display areas between the display devices from being recognized (or by way of reducing visibility of boundaries or non-display areas between the display devices) so that a viewer can be immersed into displayed images.

It should be noted that objects of embodiments of the present disclosure are not limited to the above-mentioned objects; and other objects of embodiments of the present disclosure will be apparent to those skilled in the art from the following descriptions.

According to an embodiment of the present disclosure, a tiled display includes: a first display device including a first display area including pixels, a second display device including a second display area adjacent to the first display area, and a seam between the first display area and the second display area. Each of the first display device and the second display device includes: a first base part supporting a respective one of the first display device and the second display device, a thin-film transistor layer on the first base part, the thin-film transistor layer including thin-film transistors forming the pixels and connection lines in the seam, and bridge electrodes in the seam to couple between the connection lines of the first display device and the second display device.

The first display device and the second display device may further include gate lines and data lines respectively coupled to the pixels of the first display device and the pixels of the second displayer device. The connection lines may include first connection lines coupled to the gate lines and second connection lines coupled to the data lines.

The bridge electrodes may include: first bridge electrodes coupling between the first connection lines of the first display device and the second display device, and second bridge electrodes coupling between the second connection lines of the first display device and the second display device.

The thin-film transistor layer may include: a buffer layer on the first base part, a gate insulator layer on the buffer layer, an interlayer dielectric layer on the gate insulator, and a passivation layer on the interlayer dielectric layer. Each of the thin-film transistors may include: an active area on the buffer layer, a first electrode at one end of the active area and coupled to a respective one of the data lines through a respective one of the first connection electrodes on the interlayer dielectric layer, a second electrode at an other end of the active area opposite to the one end of the active area and coupled to a light-emitting element through a respective one of the second connection electrodes on the interlayer dielectric layer, and a gate electrode on the gate insulator.

The first connection lines may be on the gate insulator. The first bridge electrodes may be on the passivation layer and may be coupled to the first connection lines through first contact holes penetrating the passivation layer and the interlayer dielectric layer.

Each of the first connection lines may be on the gate insulator and coupled to the gate electrode of a respective one of the thin-film transistors through a respective one of the gate lines.

The second connection lines may be on the interlayer dielectric layer. The second bridge electrodes may be on the passivation layer and may be coupled to the second connection lines through second contact holes penetrating the passivation layer.

Each of the second connection lines may be on the interlayer dielectric layer and may be coupled to the first electrode of a respective one of the thin-film transistors through a respective one of the data lines.

Each of the first display device and the second display device may further include a non-display area surrounding the display area. At least one of the first display device and the second display device may include: a first pad connection line on the gate insulator in the non-display area, a first pad unit on the passivation layer in the non-display area and coupled to the first pad connection line, a first flexible film on the first pad unit, and a gate driver on the first flexible film to supply a gate signal to the first pad unit.

The first pad connection line may be coupled to the gate electrode of a respective one of the thin-film transistors through a respective one of the gate lines.

Each of the first display device and the second display device may further include a non-display area surrounding the display area. At least one of the first display device and second display device may include: a second pad connection line on the interlayer dielectric layer in the non-display area, a second pad unit on the passivation layer in the non-display area and coupled to the second pad connection line, a second flexible film on the second pad unit, and a source driver on the second flexible film to supply a source voltage to the second pad unit.

The second pad connection line may be coupled to the first electrode of a respective one of the thin-film transistors through a respective one of the data lines.

Each of the first display device and the second display device may further include: a light emitting element layer on the thin-film transistor layer and including a plurality of light emitting elements, a wavelength conversion layer on the light emitting element layer and including wavelength converting units corresponding to the pixels, respectively, a color filter layer on the wavelength conversion layer and including color filters associated with the plurality of pixels, respectively, and a second base part on the color filter layer and facing the first base part.

Each of the first display device and the second display device may include: a filler layer between the light emitting element layer and the wavelength conversion layer in the display area, and a sealing member surrounding the filler layer and coupling the first base part with the second base part.

The tiled display may further include a coupling member coupling a side surface of the first base part, a side surface of the thin-film transistor layer, a side surface of the sealing member and a side surface of the second base part of the first display device with corresponding ones of the second display device.

The coupling member may protect the bridge electrodes and may insulate adjacent bridge electrodes from each other.

The first display device may include gate lines and data lines coupled to the pixels, gate drivers supplying gate signals to the gate lines, and a source drivers supplying source voltages to the data lines. The second display device may be adjacent to the first display device in a first direction and may include pixels and may include gate lines and data lines coupled to the pixels of the second display device and source drivers supplying source voltages to the data lines. The second display device may receive gate signals from the gate drivers of the first display device through the bridge electrodes.

The tiled display may further include a third display device adjacent to the first display device in a second direction perpendicular (e.g., substantially perpendicular) to the first direction. The third display device may include pixels and may include gate lines and data lines coupled to the pixels of the third display device and gate drivers supplying gate signals to the gate lines. The third display device may receive source voltages from the source drivers of the first display device through the bridge electrodes.

The tiled display may further include a fourth display device adjacent to the second display device in the second direction and adjacent to the third display device in the first direction. The fourth display device may receive source voltages from the source drivers of the second display device through the bridge electrodes, and may receive gate signals from the gate drivers of the third display device through the bridge electrodes.

The tiled display may further include a fifth display device adjacent to the fourth display device in the second direction. The fifth display device may include pixels and may include gate lines and data lines coupled to the pixels of the fifth display device and source drivers supplying source voltages to the data lines. The fourth display device may receive source voltages from the source drivers of each of the second display device and the fifth display device.

According to embodiments of the present disclosure, a tiled display includes bridge electrodes coupling between connection lines of adjacent display devices, and thus no pad unit is included in the seams. Accordingly, the display devices can be so close to each other that the seams are not recognized by a user. In this manner, it is possible to prevent the seams of the tiled display from being recognized by a user (or to reduce visibility of the seams of the tiled display), thereby providing seamless (or substantially seamless) images between the display devices and getting the user immersed into displayed images.

It should be noted that effects of embodiments of the present disclosure are not limited to those described above and other effects of embodiments of the present disclosure will be apparent to those skilled in the art from the following descriptions.

BRIEF DESCRIPTION OF THE DRAWINGS

The above and other aspects and features of embodiments of the present disclosure will become more apparent by describing in more detail embodiments thereof with reference to the attached drawings, in which.

DETAILED DESCRIPTION

Figure 1:
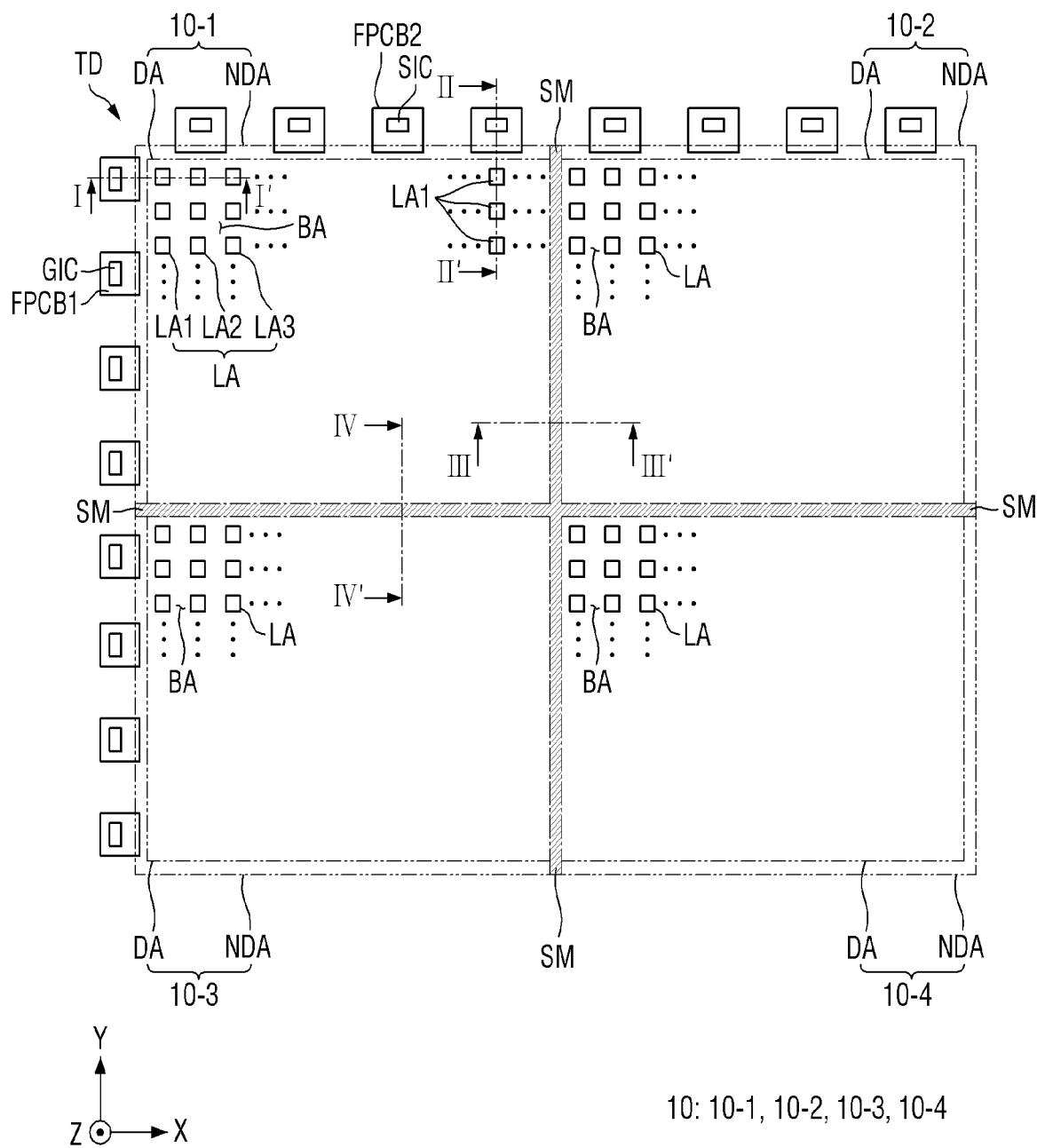
FIG. 1 is a plan view showing a tiled display according to an embodiment of the present disclosure.

In the following description, for the purposes of explanation, numerous specific details are set forth in order to provide a thorough understanding of various embodiments or implementations of the subject matter of the present disclosure. As used herein, "embodiments" and "implementations" are interchangeable words that are non-limiting examples of devices or methods employing one or more of the features of the subject matter disclosed herein. It is apparent, however, that various embodiments may be practiced without these specific details or with one or more equivalent arrangements. In other instances, existing and/or readily understood structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the spirit and scope of the present disclosure.

Unless otherwise specified, the illustrated embodiments are to be understood as providing features of varying detail of some ways in which the subject matter of the present disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit and scope of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the terms "connected" and "coupled" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the spirit and scope of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and/or the like, which may be formed using semiconductor-based fabrication techniques and/or other manufacturing technologies. In the case of the blocks, units, and/or modules being implemented by microprocessors and/or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the present disclosure. Further, the blocks, units, and/or modules of some embodiments may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view showing a tiled display according to an embodiment of the present disclosure.

Referring to FIG. 1, a tiled display TD may include a plurality of display devices 10. The plurality of display devices 10 may be arranged in, but are not limited to, a lattice pattern. The plurality of display devices 10 may be coupled in a first direction (x-axis direction) or a second direction (y-axis direction), and the tiled display TD may have a certain shape. For example, the plurality of display devices 10 may all have the same (e.g., substantially the same) size. It is, however, to be understood that the present disclosure is not limited thereto. For another example, the plurality of display devices 10 may have different sizes from each other.

Each of the plurality of display devices 10 may have a rectangular shape including longer sides and shorter sides. The display devices 10 may be arranged such that the longer sides or the shorter sides of the display devices 10 are coupled with one another. Some of the display devices 10 may be on an edge of the tiled display TD to form one side of the tiled display TD. Some others of the display devices 10 may be at a corner of the tiled display TD, and may form two adjacent sides of the tiled display TD. Still some others of the display devices 10 may be on the inner side of the tiled display TD and may be surrounded by the other display devices 10.

The display device 10 may include a display area DA and a non-display area NDA. The display area DA may include a plurality of pixels to display images. The non-display area NDA may be around the display area DA to surround the display area DA, and may not display an image (or may not be designed to display an image).

The tiled display TD may have, but is not limited to, a generally planar shape. The tiled display TD may have a three-dimensional shape, giving a viewer a three-dimensional experience. For example, when the tiled display TD has a three-dimensional shape, at least some of the display devices 10 may have a curved shape. For another example, the display devices 10 may have a flat shape and are coupled with one another at a set or predetermined angle, so that the tiled display TD may have a three-dimensional shape.

The tiled display TD may include seams SM located between the plurality of display areas DA. The tiled display TD may be formed by coupling non-display areas NDA of the adjacent display devices 10 with one another. The plurality of display devices 10 may be coupled with one another by coupling members and/or adhesive members in the seams SM. The seams SM of the plurality of display devices 10 may include neither a pad unit nor a flexible film attached to the pad unit. Accordingly, the display areas DA of the plurality of display devices 10 may be so close to each other that the seams SM therebetween are not recognized by a viewer (or substantially not recognized by a viewer). The reflectance of external light at the display areas DA of the plurality of display devices 10 may be substantially equal to the reflectance of external light at the seams SM between the display devices 10. Accordingly, it is possible to prevent the seams SM between the display devices 10 of the tiled display TD from being recognized by a viewer (or to reduce visibility of the seams SM between the display devices 10 of the tiled display TD), thereby improving the issue of visible seams and allowing the viewer to get immersed into the displayed images.

Each of the display devices 10 may include a plurality of pixels arranged in rows and columns in the display area DA. Each of the plurality of pixels may include a light-emitting area LA defined by a pixel-defining layer or a bank, and may emit light having a peak wavelength through the light-emitting area LA. For example, the display area DA of each of the display devices 10 may include first to third light-emitting areas LA1, LA2 and LA3. In each of the first to third light-emitting areas LA1, LA2 and LA3, light generated by light emitting elements of the display devices 10 exits out of the display devices 10.

The first to third light-emitting areas LA1, LA2 and LA3 may emit light having set or predetermined peak wavelengths to the outside of the display devices 10. The first light-emitting area LA1 may emit light of a first color, the second light-emitting area LA2 may emit light of a second color, and the third light-emitting area LA3 may emit light of a third color. For example, the light of the first color may be red light having a peak wavelength in a range of 610 to 650 nm, the light of the second color may be green light having a peak wavelength in a range of 510 to 550 nm, and the light of the third color may be blue light having a peak wavelength in a range of 440 to 480 nm. It is, however, to be understood that the present disclosure is not limited thereto.

The first to third light-emitting areas LA1, LA2, and LA3 may be arranged repeatedly and sequentially along the first direction (X-axis direction) of the display area DA. For example, the area of the first light-emitting area LA1 may be larger than the area of the second light-emitting area LA2, and the area of the second light-emitting area LA2 may be larger than the area of the third light-emitting area LA3. For another example, the area of the first light-emitting area LA1, the area of the second light-emitting area LA2 and the area of the third light-emitting area LA3 may be substantially all equal.

The display areas DA of the display devices 10 may include light-blocking areas BA surrounding the plurality of light-emitting areas LA. The light-blocking areas BA can prevent or reduce mixing of lights of different colors emitted from the first to third light-emitting areas LA1, LA2 and LA3.

The tiled display TD may include first to fourth display devices 10-1 to 10-4. The number and coupling relationship of the display devices 10 are not limited by the embodiment of FIG. 1. The number of the display devices 10 may be determined depending on the sizes of the display devices 10 and the tiled display TD.

A first flexible film FPCB1 may be in the non-display area NDA provided on one side of the tiled display TD. For example, the first flexible film FPCB1 may be in the non-display area NDA on the left side of the first display device 10-1 and the non-display area NDA on the left side of the third display device 10-3. The first flexible film FPCB1 may be attached to a first pad unit on a first base part of each of the first and third display devices 10-1 and 10-3. One side of the first flexible film FPCB1 may be coupled to the first pad unit, while the other side of the first flexible film FPCB1 may be coupled to a gate circuit board. The first flexible film FPCB1 may transmit a gate signal from a gate driver GIC to the display devices 10.

The gate driver GIC may be on the first flexible film FPCB1, and may be coupled to a plurality of pixels of the display devices 10. For example, the gate driver GIC may be an integrated circuit (IC). The gate driver GIC may generate gate signals based on the gate control signal from a timing controller, and may sequentially supply the gate signals to the gate lines of the display areas DA.

A second flexible film FPCB2 may be in the non-display area NDA provided on another side of the tiled display TD adjacent to the one side. For example, the second flexible film FPCB2 may be in the non-display area NDA on the upper side of the first display device 10-1 and the non-display area NDA on the upper side of the second display device 10-2. The second flexible film FPCB2 may be attached to a second pad unit on the first base part of each of the first and third display devices 10-1 and 10-2. One side of the second flexible film FPCB2 may be coupled to the second pad unit, while the other side of the second flexible film FPCB2 may be coupled to a gate circuit board. The second flexible film FPCB2 may transmit a source voltage or a data voltage of the source driver SIC to the display device 10.

The source driver SIC may be on the second flexible film FPCB2, and may be coupled to a plurality of pixels of the display devices 10. For example, the source driver SIC may be an integrated circuit (IC). The source driver SIC may convert digital video data into analog data voltage based on a source control signal from the timing controller, and may supply it to data lines of the display areas DA through the second flexible films FPCB2.

Optionally, the first flexible film FPCB1 may be additionally in the non-display area NDA on the right side of the second and fourth display devices 10, and the second flexible film FPCB2 may be additionally in the non-display area NDA on the lower side of the third and fourth display devices 10. It is, however, to be understood that the present disclosure is not limited thereto.

Figure 2:
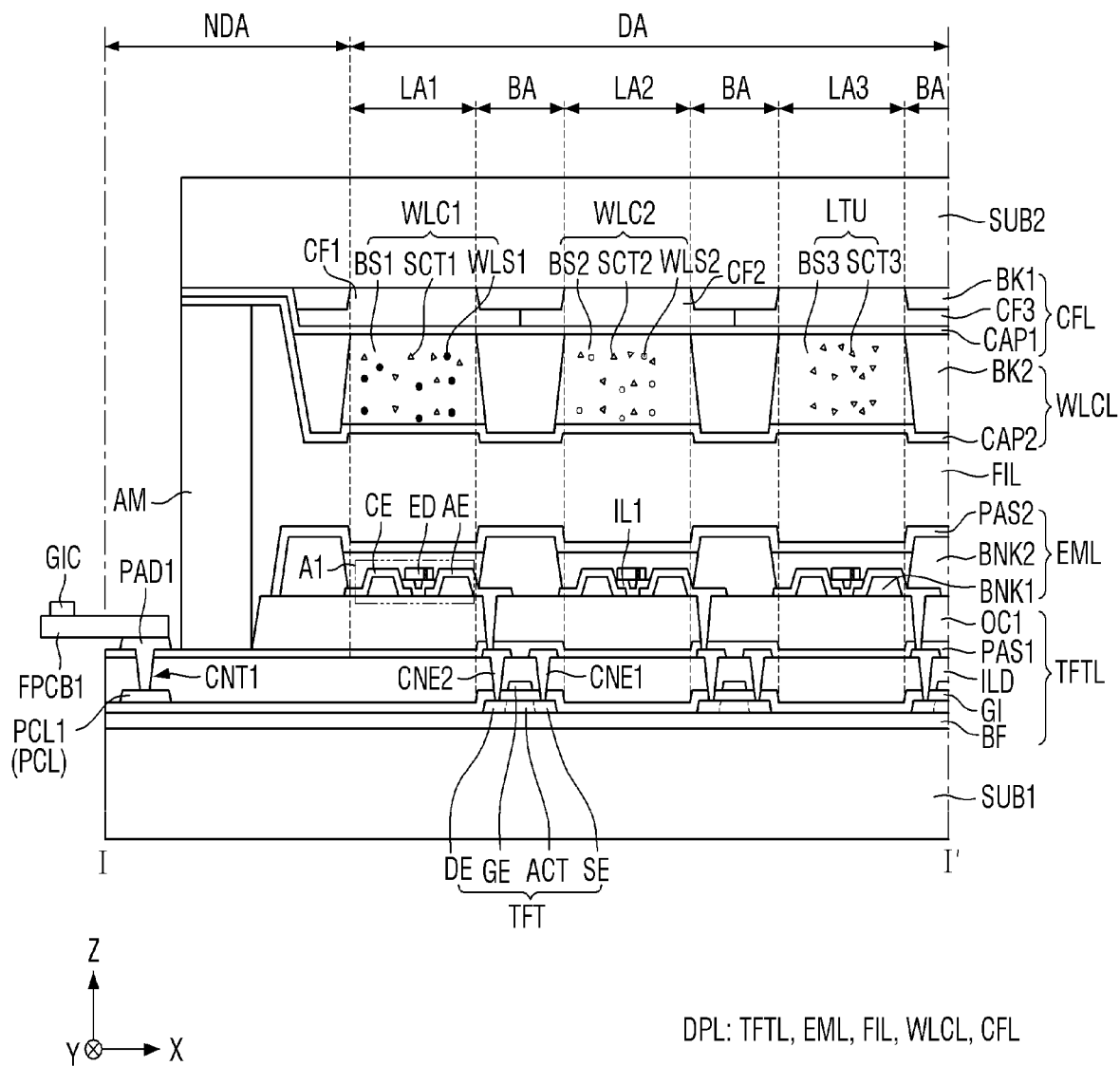
FIG. 2 is a cross-sectional view, taken along line I-I' of FIG. 1.

FIG. 2 is a cross-sectional view, taken along line I-I' of FIG. 1.

Referring to FIG. 2, the display areas DA of the display devices 10 may include first to third light-emitting areas LA1, LA2 and LA3. In the first to third light-emitting areas LA1, LA2 and LA3, lights generated by light-emitting diodes ED of the plurality of pixels exit to the outside of the display device 10.

Each of the display devices 10 may include a first base part SUB1, a display layer DPL, a sealing member AM, first pad units PAD1, first flexible films FPCB1, gate drivers GIC, and a second base part SUB2.

The first base part SUB1 may be a base substrate, and may be made of an insulating material (e.g., an electrically insulating material) such as a polymer resin. For example, the first base part SUB1 may be a rigid substrate. When the first base part SUB1 is a rigid substrate, the first base part SUB1 may include, but is not limited to, a glass material and/or a metal material. For another example, the first base part SUB1 may be a flexible substrate that can be bent, folded, and/or rolled. When the first base part SUB1 is a flexible substrate, the first base part SUB1 may include, but is not limited to, polyimide (PI).

The display layer DPL may be on the first base part SUB1. The display layer DPL may include a thin-film transistor layer TFTL, a light emitting element layer EML, a filler layer FIL, a wavelength conversion layer WLCL, and/or a color filter layer CFL.

The thin-film transistor layer TFTL may be on the first base part SUB1. The thin-film transistor layer TFTL may include a buffer layer BF, thin-film transistors TFT, a gate insulator GI, a first pad connection line PCL1, an interlayer dielectric layer ILD, first and second connection electrodes CNE1 and CNE2, a first passivation layer PAS1, and/or a first planarization layer OC1.

The buffer layer BF may be on the first base part SUB1. The buffer layer BF may include an inorganic material that can prevent or reduce the permeation of air and/or moisture. For example, the buffer layer BF may include a plurality of inorganic films stacked on one another alternately.

The thin-film transistor TFT may be on the buffer layer BF in the display area DA, and may form a pixel circuit of each of a plurality of pixels. For example, the thin-film transistor TFT may be a driving transistor or a switching transistor of the pixel circuit. The thin-film transistor TFT may include an active area ACT, a gate electrode GE, a source electrode SE, and a drain electrode DE.

The active area ACT, the source electrode SE and the drain electrode DE may be on the buffer layer BF. The active area ACT may overlap the gate electrode GE in the thickness direction and may be insulated from the gate electrode GE by the gate insulator GI. The source electrode SE and the drain electrode DE may be formed by converting the material of the active area ACT into a conductor.

The gate electrode GE may be on the gate insulator GI. The gate electrode GE may overlap the active area ACT with the gate insulator GI interposed therebetween.

The gate insulator GI may be on the active area ACT, the source electrode SE and the drain electrode DE. For example, the gate insulator GI may cover the active area ACT, the source electrode SE, the drain electrode DE and the buffer layer BF, and may insulate the active area ACT from the gate electrode GE. The gate insulator GI may include contact holes through which the first and second connection electrodes CNE1 and CNE2 pass, respectively, The first pad connection line PCL1 may be on the gate insulator GI in the non-display area NDA. The first pad connection line PCL1 may be coupled to the first pad unit PAD1 inserted in the first contact hole CNT1. The first pad connection line PCL1 may supply a gate signal received from the first pad unit PAD1 to a gate line of the display device DA. For example, the first pad connection line PCL1 may be made of, but is not limited to, the same (e.g., substantially the same) material on the same layer as the gate electrode GE of the thin-film transistor layer TFT.

The interlayer dielectric layer ILD may be on the gate electrode GE and the first pad connection line PCL1. The interlayer dielectric layers ILD may include contact holes through which the first and second connection electrodes CNE1 and CNE2 pass in the display area DA. In the display area DA, the contact holes of the interlayer dielectric layer ILD may be coupled to the contact holes of the gate insulator GI. The interlayer dielectric layer ILD may include the first contact hole CNT1 through which the first pad part PAD1 passes in the non-display area NDA. The first contact hole CNT1 of the non-display area NDA may penetrate the interlayer dielectric layer ILD and the first passivation layer PAS1.

The first and second connection electrodes CNE1 and CNE2 may be spaced apart from each other on the interlayer dielectric layer ILD. The first connection electrode CNE1 may couple the data line with the source electrode SE of the thin-film transistor TFT. The first connection electrode CNE1 may come in contact (e.g., physical contact) with the source electrode SE through the contact hole formed in the gate insulator GI and the interlayer dielectric layer ILD.

The second connection electrode CNE2 may couple the drain electrode DE of the thin-film transistor TFT with a first electrode AE of a light-emitting element EL. The second connection electrode CNE2 may come in contact (e.g., physical contact) with the drain electrode DE through the contact hole formed in the gate insulator GI and the interlayer dielectric layer ILD.

The first passivation layer PAS1 may be over the first and second connection electrodes CNE to protect the thin-film transistor TFT. The first passivation PAS1 may include a contact hole through which the first electrode AE of the light-emitting element passes in display area DA. The first passivation layer PAS1 may include a first contact hole CNT1 through which the first pad unit PAD1 passes in the non-display area NDA.

The first pad unit PAD1 may be in the non-display area NDA on the first passivation layer PAS1. The first pad unit PAD1 may be closer to the outside than the sealing member AM that couples the first base part SUB1 with the second base part SUB2. The first pad unit PAD1 may be coupled to the gate line and the gate electrode GE of the thin-film transistor TFT through the first pad connection line PCL1.

The first flexible film FPCB1 may be attached to a surface of the first pad unit PAD1. For example, the first flexible film FPCB1 may be on the first pad unit PAD1 by an anisotropic conductive film (e.g., an anisotropic, electrically conductive material), but the present disclosure is not limited thereto. One side of the first flexible film FPCB1 may be coupled to the first pad unit PAD1, while the other side of the first flexible film FPCB1 may be coupled to a gate circuit board. The first flexible film FPCB1 may transmit the gate signal of the gate driver GIC to the gate line of the display device 10.

The gate driver GIC may be on the first flexible film FPCB1, and may be coupled to a plurality of pixels of the display device 10. For example, the gate driver GIC may be an integrated circuit (IC). The gate driver GIC may generate gate signals based on the gate control signal of the timing controller, and may sequentially supply the gate signals to the gate lines of the display area DA.

The first planarization layer OC1 may be on the first passivation layer PAS1 to provide a flat surface over the thin-film transistor layer TFTL. For example, the first planarization layer OC1 may include a contact hole through which the first electrode AE of the light-emitting element EL passes. The contact hole in the first planarization layer OC1 may be coupled to the contact hole in the first passivation layer PAS1. The first planarization layer OC1 may include an organic material.

The light emitting element layer EML may include a light-emitting element, first banks BNK1, a second bank BNK2, and a second passivation layer PAS2.

The light-emitting element layer may be on the thin-film transistor layer TFTL. The light-emitting element may include a first electrode AE, a second electrode CE, and a light-emitting diode ED.

The first electrode AE may be on the first planarization layer OC1. For example, the first electrode AE may be on the first banks BNK1 disposed on the first planarization layer OC1 to cover the first banks BNK1. The first electrode AE may overlap one of the first to third light-emitting areas LA1, LA2 and LA3 defined by the second bank BNK2. The first electrode AE may be coupled to the drain electrode DE of the thin-film transistor TFT. The first electrode AE may be, but is not limited to, an anode electrode of the light-emitting element.

The second electrode CE may be on the first planarization layer OC1 such that it is spaced apart from the first electrode AE. For example, the second electrode CE may be on the first banks BNK1 on the first planarization layer OC1 to cover the first banks BNK1. The second electrode CE may overlap one of the first to third light-emitting areas LA1, LA2 and LA3 defined by the second bank BNK2. For example, the second electrode CE may receive a common voltage applied to all pixels. The second electrode CE may be, but is not limited to, a cathode electrode of the light-emitting element.

The light-emitting diode ED may be between the first electrode AE and the second electrode CE above the first planarization layer OC1. The light-emitting diode ED may be on the first insulating layer IL1 covering a part of the first electrode AE and a part of the second electrode CE. The first insulating layer IL1 may include an inorganic insulating material (e.g., an inorganic, electrically insulating material), and may include depressed portions between the first and second electrodes AE and CE. One end of the light-emitting diode ED may be coupled to the first electrode AE while the other end of the light-emitting diode ED may be coupled to the second electrode CE. For example, the plurality of light-emitting diodes ED may include active layers having the same (e.g., substantially the same) material so that they may emit lights in the same (e.g., substantially the same) wavelength range or lights of the same (e.g., substantially the same) color. The lights emitted from the first to third light-emitting areas LA1, LA2 and LA3, respectively, may have the same (e.g., substantially the same) color. For example, the light-emitting diodes ED may emit lights of the third color or blue light having a peak wavelength in a range of 440 nm to 480 nm. Therefore, the light emitting element layer EML may emit light of the third color or blue light.

The light-emitting diodes ED may have a size in a micrometer range or a nanometer range, and may be inorganic light-emitting diodes containing an inorganic material. Inorganic light-emitting diodes may be aligned between two electrodes facing each other as polarities are created by forming an electric field in a set or particular direction between the two electrodes.

As another example, the light emitting elements may include organic light-emitting diodes including an organic material. An organic light-emitting diode can emit light by combining holes and electrons in an organic emissive layer by voltages applied to each of a first electrode and a second electrode of the light-emitting element The second bank BNK2 may be on the first planarization layer OC1 to define first to third light-emitting areas LA1, LA and LA3. For example, the second bank BNK2 may surround each of the first to third light-emitting areas LA1, LA2 and LA3. It is, however, to be understood that the present disclosure is not limited thereto. The second bank BNK2 may separate and insulate (e.g., electrically insulate) the first electrode AE or the second electrode CE of a light-emitting element from that of an adjacent light-emitting element. The second bank BNK2 may be in the light-blocking areas BA.

The second passivation layer PAS2 may be on the plurality of light emitting elements and the second bank BNK2. The second passivation layer PAS2 may cover the plurality of light emitting elements to protect them. The second passivation layer PAS2 can prevent or reduce permeation of impurities such as moisture and/or air from outside to prevent or reduce damage to the plurality of light emitting elements.

A filler FIL may be used to fill the space between the light emitting element layer EML and the wavelength conversion layer WLCL, and may be surrounded by the sealing member AM. For example, the filler FIL may be made of an organic material and can transmit light. The filler FIL may be made of, but is not limited to, a silicon-based organic material, an epoxy-based organic material, etc. For another example, the filler FIL may be eliminated or omitted.

The sealing member AM may be interposed between the edge of the first base part SUB1 and the edge of the second base part SUB2 in the non-display area NDA. The sealing member AM may be located along the first base part SUB1 and the second base part SUB2 in the non-display area NDA to seal the filler FIL. The first base part SUB1 and the second base part SUB2 may be coupled with each other by the sealing member AM. For example, the sealing member AM may include an organic material. The sealing member AM may be made of, but is not limited to, an epoxy-based resin.

The wavelength conversion layer WLCL may include a second light-blocking member BK2, a first wavelength converting unit WLC1, a second wavelength converting unit WLC2, the light-transmitting unit LTU, and a second capping layer CAP2.

The second light-blocking member BK2 may be on the second capping layer CAP2 in the light-blocking areas BA. The second light-blocking member BK2 may overlap the second bank BNK2 in the thickness direction. The second light-blocking member BK2 can block or reduce the transmission of light. The second light-blocking member BK2 can improve the color gamut of the display devices 10 by preventing or reducing intrusion and/or mixing of light among the first to third light-emitting areas LA1, LA2 and LA3. The second light-blocking member BK2 may be arranged in a lattice shape surrounding the first to third light-emitting areas LA1, LA2 and LA3 when viewed from the top.

The second light-blocking member BK2 may include an organic light-blocking material and a liquid repellent component. For example, the second light-blocking member BK2 may be made of a black organic material including the liquid repellent component. The second light-blocking member BK2 may be formed via coating and/or exposure processes for an organic light-blocking material containing a liquid repellent component, etc.

The first wavelength converting unit WLC1 may be in the first light-emitting area LA1 on the second capping layer CAP2. The first wavelength converting unit WLC1 may be surrounded by the second light-blocking member BK2. The first wavelength converting unit WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one organic material selected from among an epoxy resin, an acrylic resin, a cardo resin, and an imide resin.

The first scatterers SCT1 may have a refractive index different from that of the first base resin BS1 and may form an optical interface with the first base resin BS1. For example, the first scatterers SCT1 may include a light scattering material and/or light scattering particles that scatter at least a part of transmitted light. For example, the first scatterers SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO) and/or tin oxide ($SnO_2$) and/or may include organic particles such as an acrylic resin and/or a urethane resin. The first scatters SCT1 may scatter light in random directions irrespective of the incidence direction of the incident light, without substantially changing the peak wavelength of the incident light.

The first wavelength shifters WLS1 may convert and/or shift the peak wavelength of the incident light to a first peak wavelength. For example, the first wavelength shifters WLS1 may convert blue light provided from the display device 10 into red light having a single peak wavelength in a range of 610 nm to 650 nm, and output the light. The first wavelength shifters WLS1 may be quantum dots, quantum rods, and/or phosphors. The quantum dots may be particulate matter that emits a color as electrons transition from the conduction band to the valence band.

A part of the blue light emitted from the light emitting element layer EML may pass through the first wavelength converting unit WLC1 without being converted into red light by the first wavelength shifters WLS1. When such blue light is incident on the first color filter CF1, it can be blocked (or its intensity can be reduced) by the first color filter CF1. On the other hand, red light converted by the first wavelength converting unit WLC1 may pass through the first color filter CF1 to exit to the outside. Accordingly, the first light-emitting area LA1 may emit red light.

The second wavelength converting unit WLC2 may be in the second light-emitting area LA2 on the second capping layer CAP2. The second wavelength converting unit WLC2 may be surrounded by the second light-blocking member BK2. The second wavelength converting unit WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same (e.g., substantially the same) material as the first base resin BS1 or may be made of one of the above-listed materials of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same (e.g., substantially the same) material as the first scatterers SCT1 or may be made of one of the above-listed materials of the first scatterers SCT1. The second scatters SCT2 may scatter light in random directions irrespective of the incidence direction of the incident light, without substantially changing the peak wavelength of the incident light.

The second wavelength shifters WLS2 may convert and/or shift the peak wavelength of the incident light to a second peak wavelength that is different from the first peak wavelength of the first wavelength shifters WLS1. For example, the second wavelength shifters WLS2 may convert blue light provided from the display device 10 into blue light having a single peak wavelength in a range of 510 nm to 550 nm, and output the light. The second wavelength shifters WLS2 may be quantum dots, quantum rods, and/or phosphors. The second wavelength shifters WLS2 may include the above-listed materials of the first wavelength shifters WLS1. The wavelength conversion range of the second wavelength shifters WLS2 may be formed of quantum dots, quantum rods, and/or phosphors so that it is different from the wavelength conversion range of the first wavelength shifters WLS1.

The light-transmitting unit LTU may be in the third light-emitting area LA3 on the second capping layer CAP2. The light-transmitting unit LTU may be surrounded by the second light-blocking member BK2. The light-transmitting unit LTU may transmit the incident light without converting its peak wavelength. The light-transmitting unit LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same (e.g., substantially the same) material as the first base resin BS1 or the second resin BS2 or may be made of one of the above-listed materials of the first base resin BS1 or the second base resin BS2.

The third scatterers SCT3 may have a refractive index different from that of the third base resin BS3 and may form an optical interface with the third base resin BS3. For example, the third scatterers SCT3 may include a light scattering material and/or light scattering particles that scatter at least a part of transmitted light. For example, the third scatterers SCT3 may be made of the same (e.g., substantially the same) material as the first scatterers SCT1 and/or the second scatterers SCT2, or may be made of one of the above-listed materials of the first scatterers SCT1 and/or the second scatterers SCT2. The third scatters SCT3 may scatter light in random directions irrespective of the incidence direction of the incident light, without substantially changing the peak wavelength of the incident light.

The second capping layer CAP2 may cover the bottoms of the first and second wavelength converting units WLC1 and WLC2, the light-transmitting unit LTU and the first light-blocking member BK1. For example, the second capping layer CAP2 may seal the first and second wavelength converting units WLC1 and WLC2 and the light-transmitting unit LTU to thereby prevent or reduce damage to and/or contamination of the first and second wavelength converting units WLC1 and WLC2 and the light-transmitting unit LTU. For example, the second capping layer CAP2 may include an inorganic material.

The color filter layer CFL may include the first capping layer CAP1, the first light-blocking member BK1, and the first to third color filters CF1, CF2, and CF3.

The first capping layer CAP1 may be on the wavelength conversion layer WLCL. The first capping layer CAP1 may seal the lower surfaces of the first to third color filters CF1, CF2, and CF3. For example, the first capping layer CAP1 may include an inorganic material.

The first light-blocking member BK1 may be under the second base part SUB2 in the light-blocking areas BA. The first light-blocking member BK1 may overlap the second light-blocking member BK2 or the second bank BNK2 in the thickness direction. The first light-blocking member BK1 can block or reduce the transmission of light. The first light-blocking member BK1 can improve the color gamut of the display devices 10 by preventing or reducing intrusion and/or mixing of lights among the first to third light-emitting areas LA1, LA2 and LA3. The first light-blocking member BK1 may be arranged in a lattice shape surrounding the first to third light-emitting areas LA1, LA2, and LA3 when viewed from the top.

The first color filter CF1 may be in the first light-emitting area LA1 under the second base part SUB2. The first color filter CF1 may be surrounded by the first light-blocking member BK1. The first color filter CF1 may overlap the first wavelength converting unit WLC1 in the thickness direction. The first color filter CF1 may selectively transmit light of the first color (e.g., red light) and may block (or reduce the intensity of) and absorb light of the second color (e.g., green light) and light of the third color (e.g., blue light). For example, the first color filter CF1 may be a red color filter and may include a red colorant.

The second color filter CF2 may be in the second light-emitting area LA2 under the second base part SUB2. The second color filter CF2 may be surrounded by the first light-blocking member BK1. The second color filter CF2 may overlap the second wavelength converting unit WLC2 in the thickness direction. The second color filter CF2 may selectively transmit light of the second color (e.g., green light) and may block (or reduce the intensity of) and absorb light of the first color (e.g., red light) and light of the third color (e.g., blue light). For example, the second color filter CF2 may be a green color filter and may include a green colorant.

The third color filter CF3 may be in the third light-emitting area LA3 under the second base part SUB2. The third color filter CF3 may be surrounded by the first light-blocking member BK1. The third color filter CF3 may overlap the light-transmitting unit LTU in the thickness direction. The third color filter CF3 may selectively transmit light of the third color (e.g., blue light) and may block (or reduce the intensity of) and absorb light of the first color (e.g., red light) and light of the second color (e.g., green light). For example, the third color filter CF3 may be a blue color filter and may include a blue colorant.

The first to third color filters CF1, CF2 and CF3 may absorb a part of the light introduced from the outside of the display device 10 to reduce reflection of external light. Accordingly, the first to third color filters CF1, CF2 and CF3 can prevent or reduce color distortion due to reflection of external light.

The second base part SUB2 may be on the color filter layer CFL. The second base part SUB2 may support and protect the display device 10. The second base part SUB2 may be a base substrate, and may be made of an insulating material (e.g., an electrically insulating material) such as a polymer resin. For example, the second base part SUB2 may be a rigid substrate. When the second base part SUB2 is a rigid substrate, the second base part SUB2 may include, but is not limited to, a glass material and/or a metal material. For another example, the second base part SUB2 may be a flexible substrate that can be bent, folded, and/or rolled. When the second base part SUB2 is a flexible substrate, the second base part SUB2 may include, but is not limited to, polyimide (PI).

Figure 3:
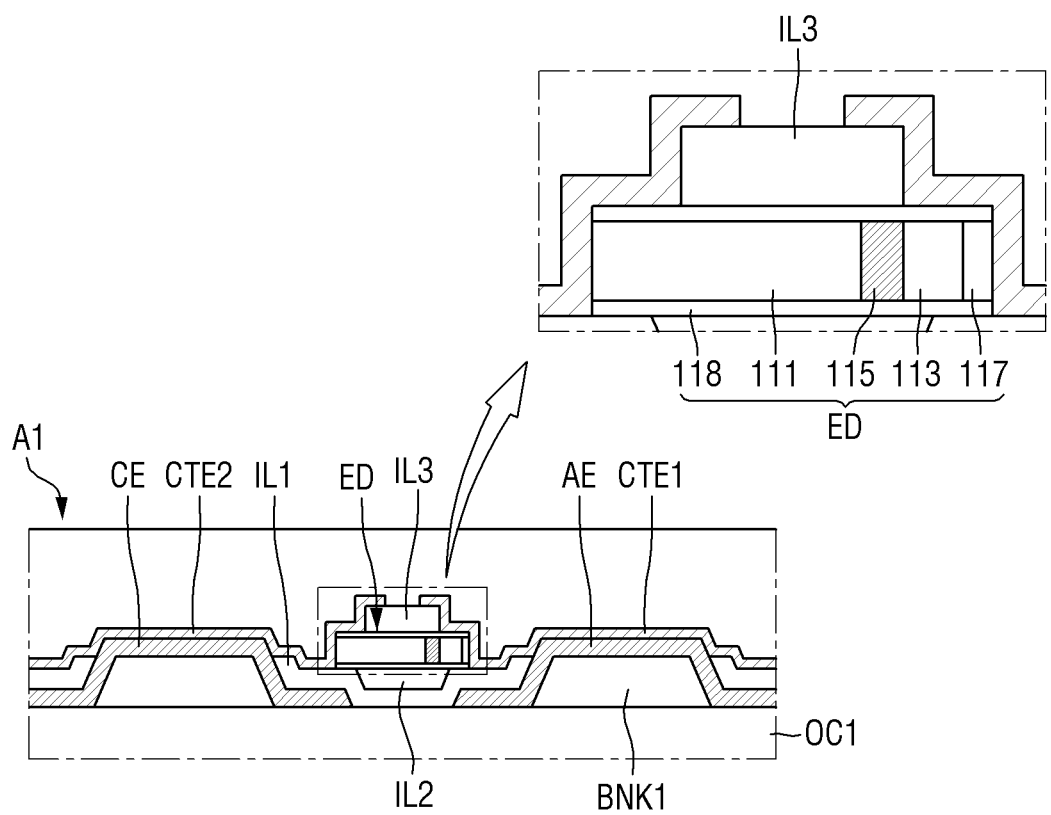
FIG. 3 is an enlarged view of area A1 of FIG. 2.

FIG. 3 is an enlarged view of area A1 of FIG. 2.

Referring to FIG. 3, the light emitting element layer EML of the display device 10 may be on the thin-film transistor layer TFTL, and may include first to third insulating layers IL1, IL2 and IL3.

The plurality of first banks BNK1 may be in the first to third light-emitting areas LA1, LA2 and LA3, respectively. Each of the plurality of first banks BNK1 may be associated with the first electrode AE or the second electrode CE. The plurality of first banks BNK1 may be on the first planarization layer OC1, and the side surfaces of each of the plurality of first banks BNK1 may be inclined from the first planarization layer OC1. Each of the first and second electrodes AE and CE may be on the respective first banks BNK1. The first banks BNK1 may include, but is not limited to, polyimide (PI).

The first and second electrodes AE and CE may include a transparent conductive material (e.g., a transparent, electrically conductive material). For example, each of the first and second electrodes AE and CE may include, but is not limited to, at least one of indium tin oxide (ITO), indium zinc oxide (IZO), and indium tin-zinc oxide (ITZO).

The first and second electrodes AE and CE may include a conductive material (e.g., an electrically conductive material) having high reflectivity. For example, the first and second electrodes AE and CE may include a metal having high reflectivity, such as silver (Ag), copper (Cu), and/or aluminum (Al). The first and second electrodes AE and CE can reflect light incident from the light-emitting diodes ED toward the upper side of the display device 10.

The first insulating layer IL1 may be on the first planarization layer OC1, the first electrode AE, and the second electrode CE. The first insulating layer IL1 may partially cover each of the first and second electrodes AE and CE. For example, the first insulating layer IL1 may include openings exposing portions of the first and second electrodes AE and CE corresponding to the upper surfaces of the first banks BNK1. The first insulating layer IL1 can protect the first and second electrodes AE and CE and may insulate the first and second electrodes AE and CE from each other. The first insulating layer IL1 can prevent or reduce direct contact of the light-emitting diodes ED with other elements and thereby prevent or reduce damage to the first insulating layer IL1.

For example, the first insulating layer IL1 may include an inorganic insulating material, and may include depressed portions between the first and second electrodes AE and CE. The depressed portions of the first insulating layer IL1 may be filled with the second insulating layer IL2. Accordingly, the second insulating layer IL2 can make the upper surface of the first insulating layer IL1 even, and accordingly the light-emitting diodes ED may be on the first and second insulating layers IL1 and IL2.

The light-emitting diodes ED may be between the first electrode AE and the second electrode CE on the first and second insulating layers IL1 and IL2. Each of the light-emitting diodes ED may have one end coupled to the first electrode AE while each of the light-emitting diodes ED may have an other end coupled to the second electrode CE. For example, the light-emitting diodes ED may be coupled to the first electrode AE through the first contact electrode CTE1 and may be coupled to the second electrode CE through the second contact electrode CTE2.

The light-emitting diodes ED may have a size in a micrometer range or a nanometer range, and may be inorganic light-emitting diodes containing an inorganic material. Inorganic light-emitting diodes may be aligned between two electrodes facing each other as polarities are created by forming an electric field in a set or particular direction between the two electrodes.

The light-emitting diode ED may include a first semiconductor layer 111, a second semiconductor layer 113, an active layer 115, an electrode layer 117, and an insulating layer 118.

The first semiconductor layer 111 may be an n-type semiconductor. For example, when the light-emitting element EL emits blue light, the first semiconductor layer 111 may include a semiconductor material having the following chemical formula: $Al_xGa_yIn_{1-x-y}N$ ($0 \leq x \leq 1$, $0 \leq y \leq 1$, $0 \leq x+y \leq 1$). The first semiconductor layer 111 may be at least one semiconductor material selected from among n-type doped AlGaInN, GaN, AlGaN, InGaN, AlN, and InN. The first semiconductor layer 111 may be doped with an n-type dopant such as Si, Ge, and/or Sn. The first semiconductor layer 111 may be n-GaN doped with n-type Si.

The second semiconductor layer 113 may be on the active layer 115. For example, when the light-emitting element EL emits blue light or green light, the second semiconductor layer 113 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 113 may be at least one semiconductor material selected from among p-type doped AlGaInN, GaN, AlGaN, InGaN, AlN, and InN. The second semiconductor layer 113 may be doped with a p-type dopant such as Mg, Zn, Ca, Se, and/or Ba. The second semiconductor layer 113 may be p-GaN doped with p-type Mg.

The active layer 115 may be between the first and second semiconductor layers 111 and 113. The active layer 115 may include a material having a single or multiple quantum well structure. When the active layer 115 includes a material having the multiple quantum well structure, quantum layers and well layers may be alternately stacked on one another. The active layer 115 may emit light as electron-hole pairs are combined therein in response to an electrical signal applied through the first semiconductor layer 111 and the second semiconductor layer 113. For example, when the active layer 115 emits blue light, it may include a material such as AlGaN and/or AlGaInN. When the active layer 115 has a multi-quantum well structure in which quantum layers and well layers are alternately stacked on one another, the quantum layers may include AlGaN, AlGaInN, etc., and the well layers may include GaN, AlInN, etc. The active layer 115 may include AlGaInN as a quantum layer and AlInN as a well layer to emit blue light.

The electrode layer 117 may be an ohmic contact electrode. For another example, the electrode layer 117 may be a Schottky contact electrode. The light-emitting diode ED may include at least one electrode layer 117. The electrode layer 117 can reduce the resistance between the light-emitting diode ED and the first or second contact electrode CTE1 or CTE2 when the light-emitting diode ED is electrically coupled to the first or second contact electrode CTE1 or CTE2. The electrode layer 117 may include a metal having conductivity (e.g., electrical conductivity).

The insulating layer 118 may surround the outer surfaces of the plurality of semiconductor layers and electrode layers. The insulating layer 118 may surround the outer surface of the active layer 115 and may be extended in the direction in which the light-emitting diode ED is extended. The insulating layer 118 can protect the light-emitting diode ED. For example, the insulating layer 118 may surround the side surface of the light-emitting diode ED and may expose both ends of the light-emitting diode ED in the longitudinal direction. In addition, because the insulating layer 118 protects the outer surface of the light-emitting diode ED, including the active layer 115, it is possible to prevent or reduce a decrease in the luminous efficiency.

The third insulating layer IL3 may be partially on the light-emitting diodes ED between the first electrode AE and the second electrode CE. The third insulating layer IL3 may partially cover the outer surfaces of the light-emitting diodes ED. The third insulating layer IL3 can protect the light-emitting diodes ED.

The first contact electrode CTE1 may partially cover the first electrode AE2 and the light-emitting diode ED, and may electrically couple the first electrode AE2 with the light-emitting diode ED. The second contact electrode CTE2 may partially cover the second electrode CE and the light-emitting diode ED, and may electrically couple the second electrode CE with the light-emitting diode ED. The first and second contact electrodes CTE1 and CTE2 may include a conductive material (e.g., an electrically conductive material). For example, the first and second contact electrodes CTE1 and CTE2 may include, but is not limited to, ITO, IZO, ITZO, aluminum (Al), etc.

Figure 4:
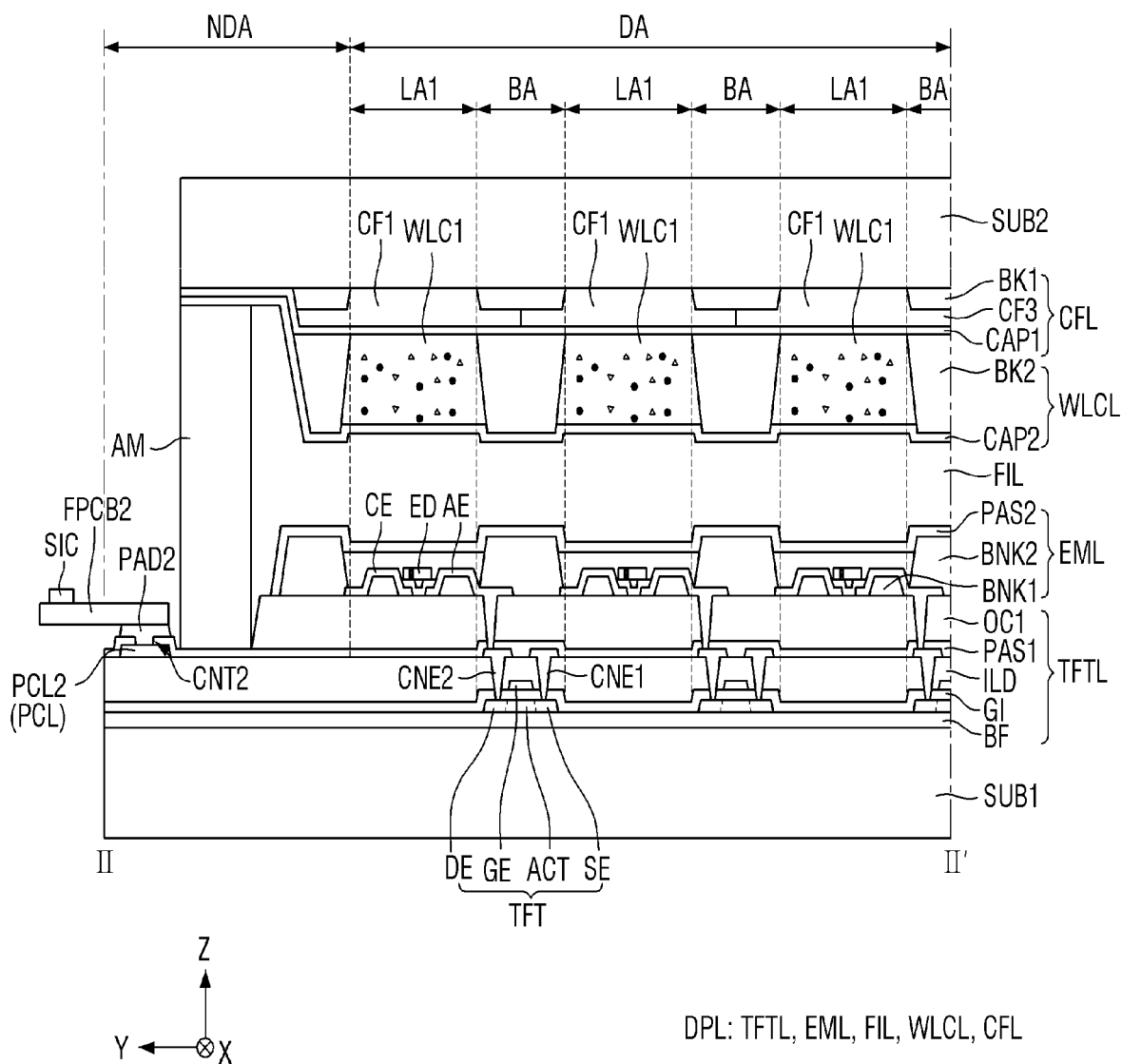
FIG. 4 is a cross-sectional view taken along line II-II' of FIG. 1.

FIG. 4 is a cross-sectional view taken along line II-II' of FIG. 1. A display device of FIG. 4 is substantially identical to the display device of FIG. 2 except for configurations of a second pad connection line PCL2, a second pad unit PAD2, a second flexible film FPCB2 and a source driver SIC; and, therefore, redundant descriptions thereof will not be repeated here.

Referring to FIG. 4, the display device 10 may include the first base part SUB1, the display layer DPL, the sealing member AM, the second pad unit PAD2, the second flexible film FPCB2, the source driver SIC, and/or the second base part SUB2. The display layer DPL may include a thin-film transistor layer TFTL, a light emitting element layer EML, a filler layer FIL, a wavelength conversion layer WLCL, and/or a color filter layer CFL.

The thin-film transistor layer TFTL may further include the second pad connection line PCL2. The second pad connection line PCL2 may be on the interlayer dielectric layer ILD in the non-display area NDA. The second pad connection line PCL2 may be coupled to the second pad unit PAD2 inserted in the second contact hole CNT2. The second pad connection line PCL2 may supply a source voltage or data voltage received from the second pad unit PAD2 to a data line of the display area DA. For example, the second pad connection line PCL2 may be made of, but is not limited to, the same (e.g., substantially the same) material on the same layer as the first and second connection electrodes CNE1 and CNE2 of the thin-film transistor layer TFT.

The second pad unit PAD2 may be in the non-display area NDA on the first passivation layer PAS1. The second pad unit PAD2 may be closer to the outside than the sealing member AM that couples the first base part SUB1 with the second base part SUB2. The second pad unit PAD2 may be coupled to the data line, the first connection electrode CNE1 and the source electrode SE of the thin-film transistor TFT through the second pad connection line PCL2.

The second flexible film FPCB2 may be attached to a surface of the second pad unit PAD2. For example, the second flexible film FPCB2 may be on the second pad unit PAD2 by an anisotropic conductive film (e.g., an anisotropic, electrically conductive material), but the present disclosure is not limited thereto. One side of the second flexible film FPCB2 may be coupled to the second pad unit PAD2, while the other side of the second flexible film FPCB2 may be coupled to a source circuit board. The second flexible film FPCB2 may transmit a source voltage or a data voltage of the source driver SIC to the data line of the display device 10.

The source driver SIC may be on the second flexible film FPCB2, and may be coupled to a plurality of pixels of the display device 10. For example, the source driver SIC may be an integrated circuit (IC). The source driver SIC may convert digital video data into analog data voltage based on a source control signal from a timing controller, and may supply the analog data voltage to the data line of the display area DA through the second flexible films FPCB2.

Figure 5:
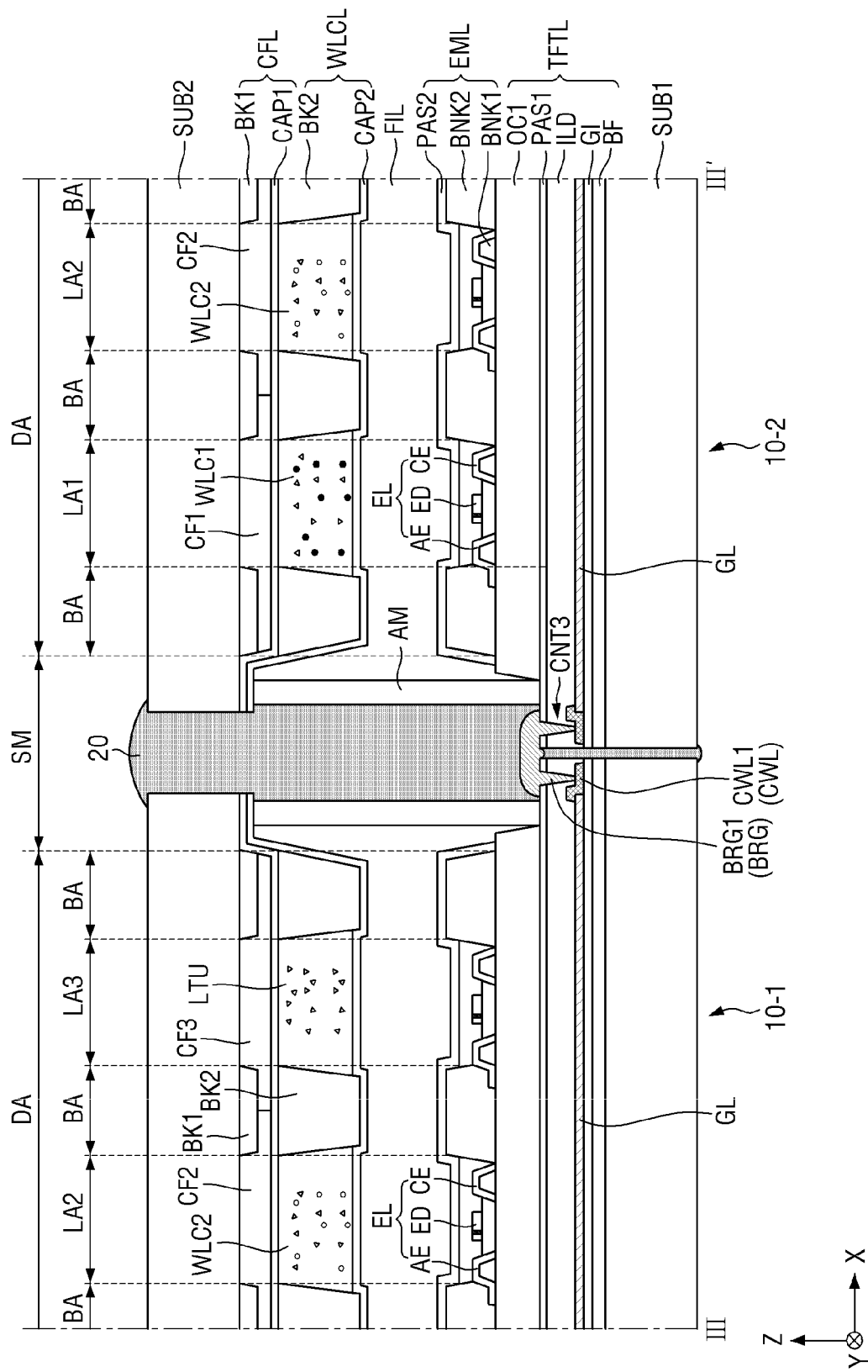
FIG. 5 is a cross-sectional view, taken along line III-III' of FIG. 1.
Figure 6:
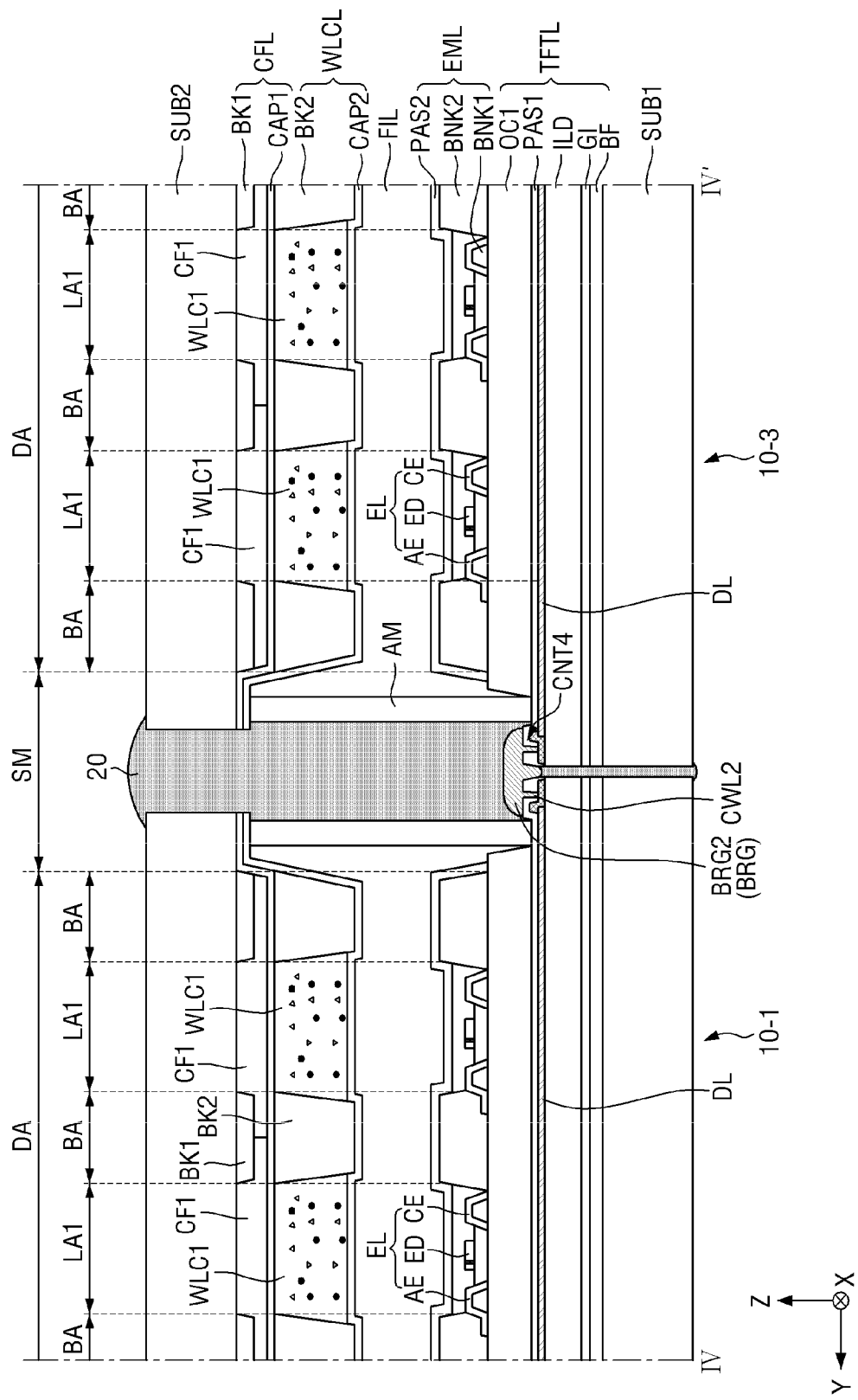
FIG. 6 is a cross-sectional view taken along line IV-IV' of FIG. 1.
Figure 7:
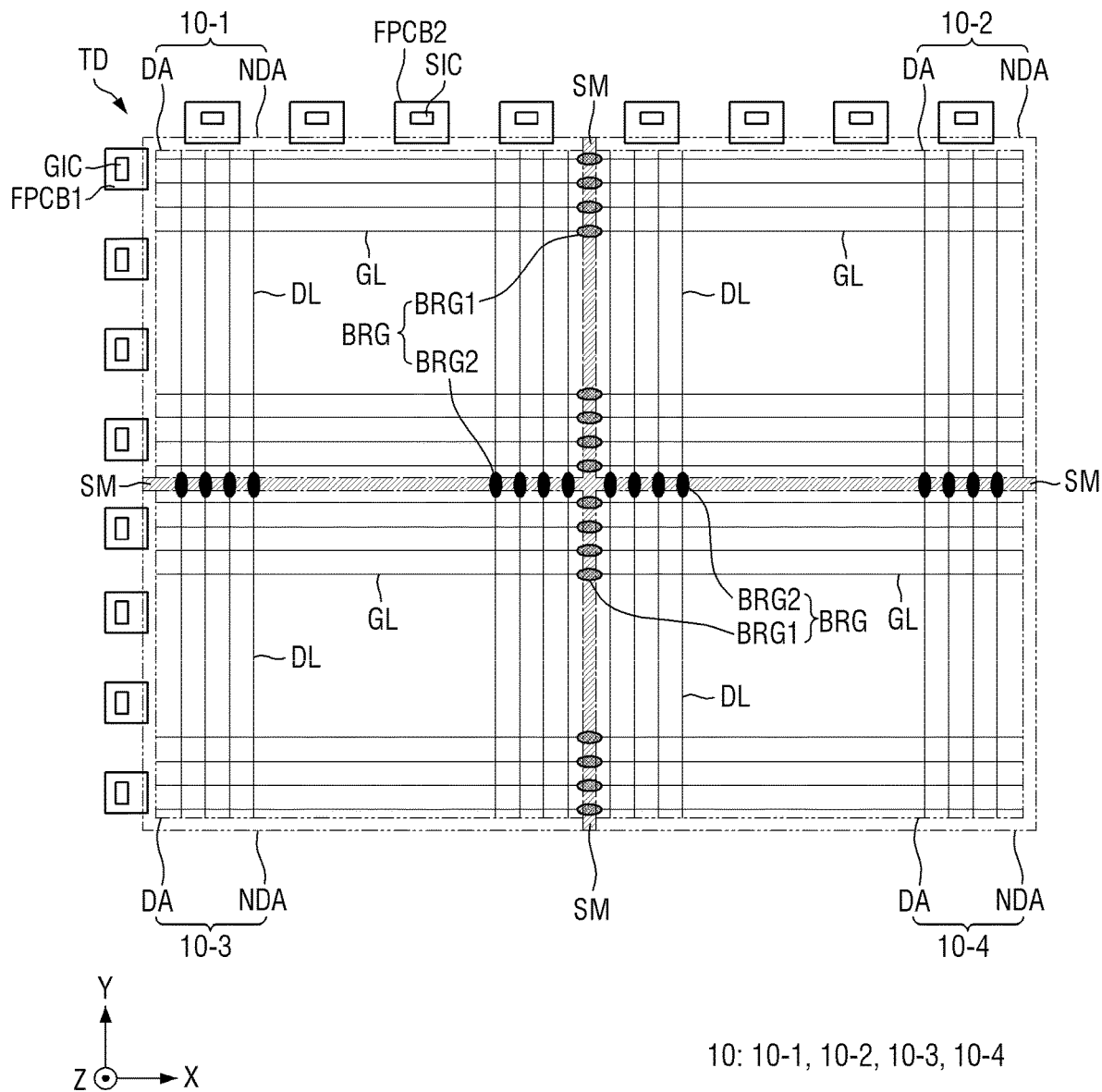
FIG. 7 is a diagram showing connection relationships between gate lines, data lines and bridge electrodes of a plurality of display devices in a tiled display according to an embodiment.

FIG. 5 is a cross-sectional view, taken along line III-III' of FIG. 1. FIG. 6 is a cross-sectional view taken along line IV-IV' of FIG. 1. FIG. 7 is a diagram showing connection relationships between gate lines, data lines, and bridge electrodes of a plurality of display devices in a tiled display according to an embodiment.

Referring to FIGS. 5 to 7, a tiled display TD may include a plurality of display devices 10 and coupling members 20. For example, the tiled display TD may include first to fourth display devices 10-1 to 10-4 according to the embodiment of FIG. 7, but the number of display devices 10 is not limited to four. The number of display devices 10 may be determined depending on the sizes of the display devices 10 and the tiled display TD.

The tiled display TD may include a display area DA of the first display device 10-1, a display area DA of the second display device 10-2, and seams SM between the display areas DA of the first and second display devices 10-1 and 10-2.

Each of the first and second display devices 10-1 and 10-2 may include gate lines GL and data lines DL coupled to a plurality of pixels, connection lines CWL, and bridge electrodes BRG.

The plurality of gate lines GL may be extended in the first direction (x-axis direction) and may be spaced apart from each other in the second direction (y-axis direction). The plurality of gate lines GL may supply the gate signals received from the gate driver GIC to the gate electrodes GE of the thin-film transistors TFT of the plurality of pixels.

The plurality of data lines DL may be extended in the second direction (y-axis direction) and may be spaced apart from each other in the first direction (x-axis direction). The data lines DL may supply the source voltage received from the source driver SIC to the source electrodes SE of the thin-film transistors TFT of the plurality of pixels.

The connection lines CWL may include first and second connection lines CWL1 and CWL2, and the bridge electrodes BRG may include first and second bridge electrodes BRG1 and BRG2. The first connection line CWL1 may be associated with the first bridge electrode BRG1, and the second connection line CWL2 may be associated with the second bridge electrode BRG2.

The first connection line CWL1 may be on the gate insulator GI in the seam SM. The first connection line CWL1 may be coupled to the gate line GL of the display area DA. The first connection line CWL1 may be made of the same (e.g., substantially the same) material on the same layer as the gate line GL and the gate electrode GE of the thin-film transistor TFT, but the present disclosure is not limited thereto. The first connection line CWL1 may be coupled between the gate line GL and the first bridge electrode BRG1.

The first bridge electrode BRG1 may couple between the first connection lines CWL1 of adjacent display devices 10. The first bridge electrode BRG1 may be on the first passivation layer PAS1 in the seam SM. The first bridge electrode BRG1 may be inserted into the third contact hole CNT3 penetrating the first passivation layer PAS1 and the interlayer dielectric layer ILD and may be in contact (e.g., physical contact) with the first connection line CWL1. For example, one end of the first bridge electrode BRG1 may be inserted into the third contact hole CNT3 of the first display device 10-1 to be in contact (e.g., physical contact) with the first connection line CWL1 of the first display device 10-1. The other end of the first bridge electrode BRG1 may be inserted into the third contact hole CNT3 of the second display device 10-2 to be in contact (e.g., physical contact) with the first connection line CWL1 of the second display device 10-2. The gate drivers GIC on the left side of the first display device 10-1 may supply gate signals to the gate lines GL of the first display device 10-1. The gate lines GL of the first display device 10-1 may be extended from left side to the right side of the display area DA to be coupled to the first connection lines CWL1 of the seam SM. Gate signals of gate lines GL of the first display device 10-1 may be supplied to second gate lines GL of the second display device 10-2 through first connection lines CWL1 of the first display device 10-1, first bridge electrodes BRG1 and first connection lines CWL1 of the second display device 10-2.

Some of the display devices 10 of the tiled display TD may include the gate drivers GIC, while some others of the display devices 10 may not. For example, the first display device 10-1 including the gate drivers GIC may supply gate signals to the second display device 10-2 through the first bridge electrodes BRG1 in the seam SM. That is to say, as the tiled display TD includes the first bridge electrodes BRG1 coupling between the first connection lines CWL1 of the adjacent display devices 10, it includes neither the first pad unit PAD1 nor the first flexible film FPCB1 in the seams SM.

The second connection line CWL2 may be on the interlayer dielectric layer ILD in the seam SM. The second connection line CWL2 may be coupled to the data line DL of the display area DA. The second connection line CWL2 may be made of the same (e.g., substantially the same) material on the same layer as the data line DL and the first and second connection electrodes CNE1 and CNE2. It is, however, to be understood that the present disclosure is not limited thereto. The second connection line CWL2 may be coupled between the data line DL and the second bridge electrode BRG2.

The second bridge electrode BRG2 may couple between the second connection lines CWL2 of adjacent display devices 10. The second bridge electrode BRG2 may be on the first passivation layer PAS1 in the seam SM. The second bridge electrode BRG2 may be inserted into the fourth contact hole CNT4 penetrating the first passivation layer PAS1 and may be in contact (e.g., physical contact) with the second connection line CWL2. For example, one end of the second bridge electrode BRG2 may be inserted into the fourth contact hole CNT4 of the first display device 10-1 to be in contact (e.g., physical contact) with the second connection line CWL2 of the first display device 10-1. The other end of the second bridge electrode BRG2 may be inserted into the fourth contact hole CNT4 of the third display device 10-3 to be in contact (e.g., physical contact) with the second connection line CWL2 of the third display device 10-3. The source drivers SIC on the upper side of the first display device 10-1 may supply source voltages to the data lines DL of the first display device 10-1. The data lines DL of the first display device 10-1 may be extended from upper side to the lower side of the display area DA to be coupled to the second connection lines CWL2 of the seam SM. Supply voltages of data lines DL of the first display device 10-1 may be supplied to second data lines DL of the third display device 10-3 through second connection lines CWL2 of the first display device 10-1, second bridge electrodes BRG2 and second connection lines CWL2 of the third display device 10-3.

Some of the display devices 10 of the tiled display TD may include the source drivers SIC, while some others of the display devices 10 may not. For example, the first display device 10-1 including the source drivers SIC may supply source voltages to the third display device 10-3 through the second bridge electrodes BRG2 in the seam SM. That is to say, as the tiled display TD includes the second bridge electrodes BRG2 coupling between the second connection lines CWL2 of the adjacent display devices 10, it includes neither the second pad unit PAD1 nor the second flexible film FPCB2 in the seams SM.

The tiled display TD may not include the first and second pad units PAD1 and PAD2 in the seams SM, and thus, the distance between the display areas DA of the display devices 10 may be so close that the seams SM are not recognized by the user. The reflectance of external light at the display areas DA of the display devices 10 may be equal to the reflectance of the external light at the seams SM. Accordingly, it is possible to prevent the seams SM of the tiled display TD from being recognized by a viewer (or to reduce visibility of the seams SM of the tiled display TD), thereby providing seamless images between the display devices 10 and getting the viewer immersed into displayed images.

The coupling members 20 may be between every two of the display devices 10 of the tiled display TD to couple the side surfaces of the adjacent display devices 10 with each other. The coupling members 20 may couple between the side surfaces of the first to fourth display devices 10-1 to 10-4 arranged in a lattice pattern to implement the tiled display TD. The coupling members 20 may couple the side surfaces of the first base parts SUB1, the side surfaces of the thin-film transistor layers TFTL, the side surfaces of the sealing members AM and the side surfaces of the second base parts SUB2 of the display devices 10 adjacent to each other. The coupling members 20 can protect the bridge electrodes BRG and insulate (e.g., electrically insulate) adjacent bridge electrodes BRG from each other.

For example, the coupling members 20 may be implemented as adhesives or double-sided tapes having a relatively thin thickness, thereby reducing the gap between the display devices 10. For another example, the coupling members 20 may be implemented as a coupling frame having a relatively small thickness, so that the gaps between the plurality of display devices 10 can be reduced. Accordingly, it is possible to prevent the seams SM between the display devices 10 of the tiled display TD from being recognized by a viewer (or to reduce visibility of the seams SM between the display devices 10).

Figure 8:
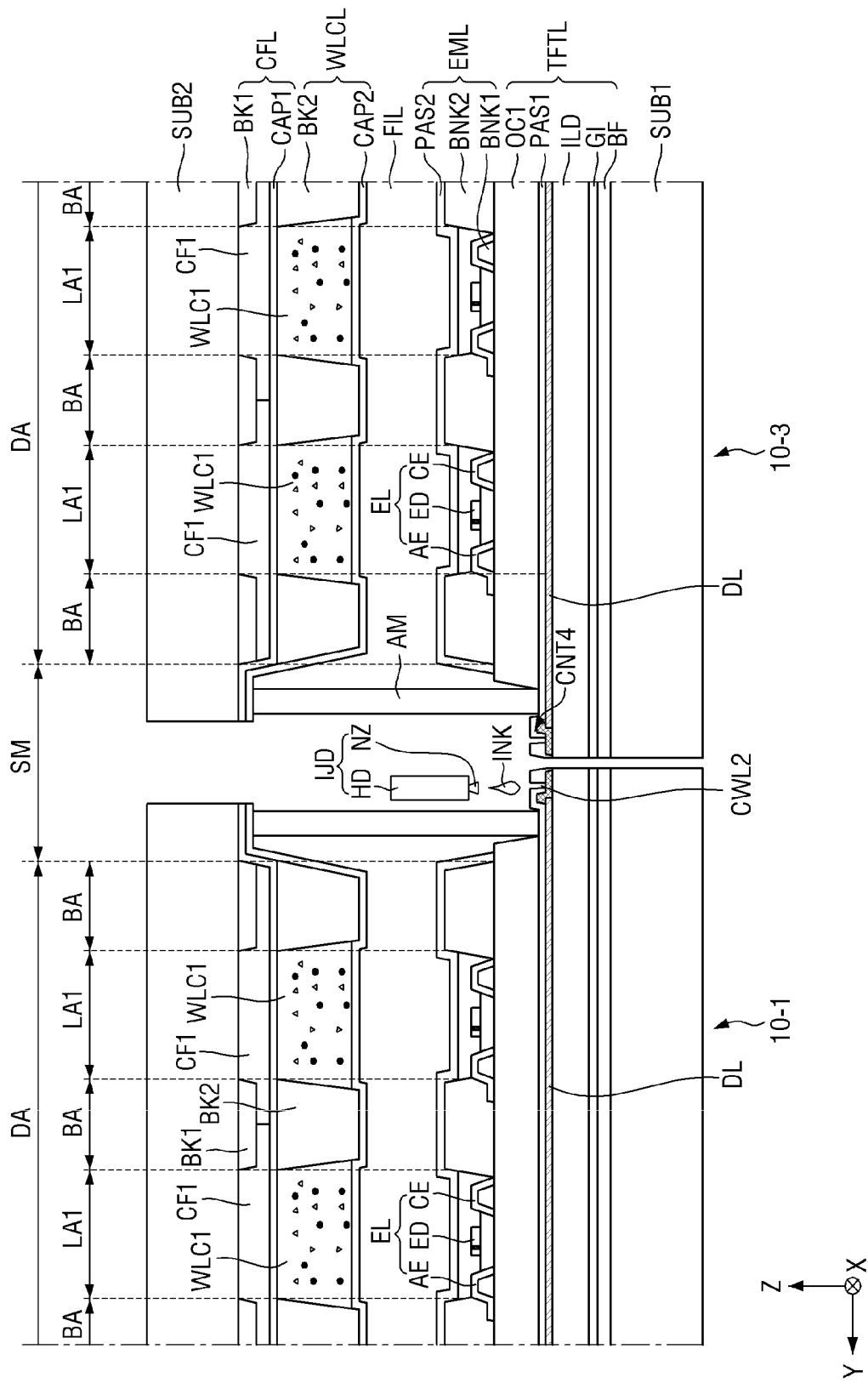
FIGS. 8 to 10 are cross-sectional views showing processes of fabricating the tiled display of FIG. 6.
Figure 9:
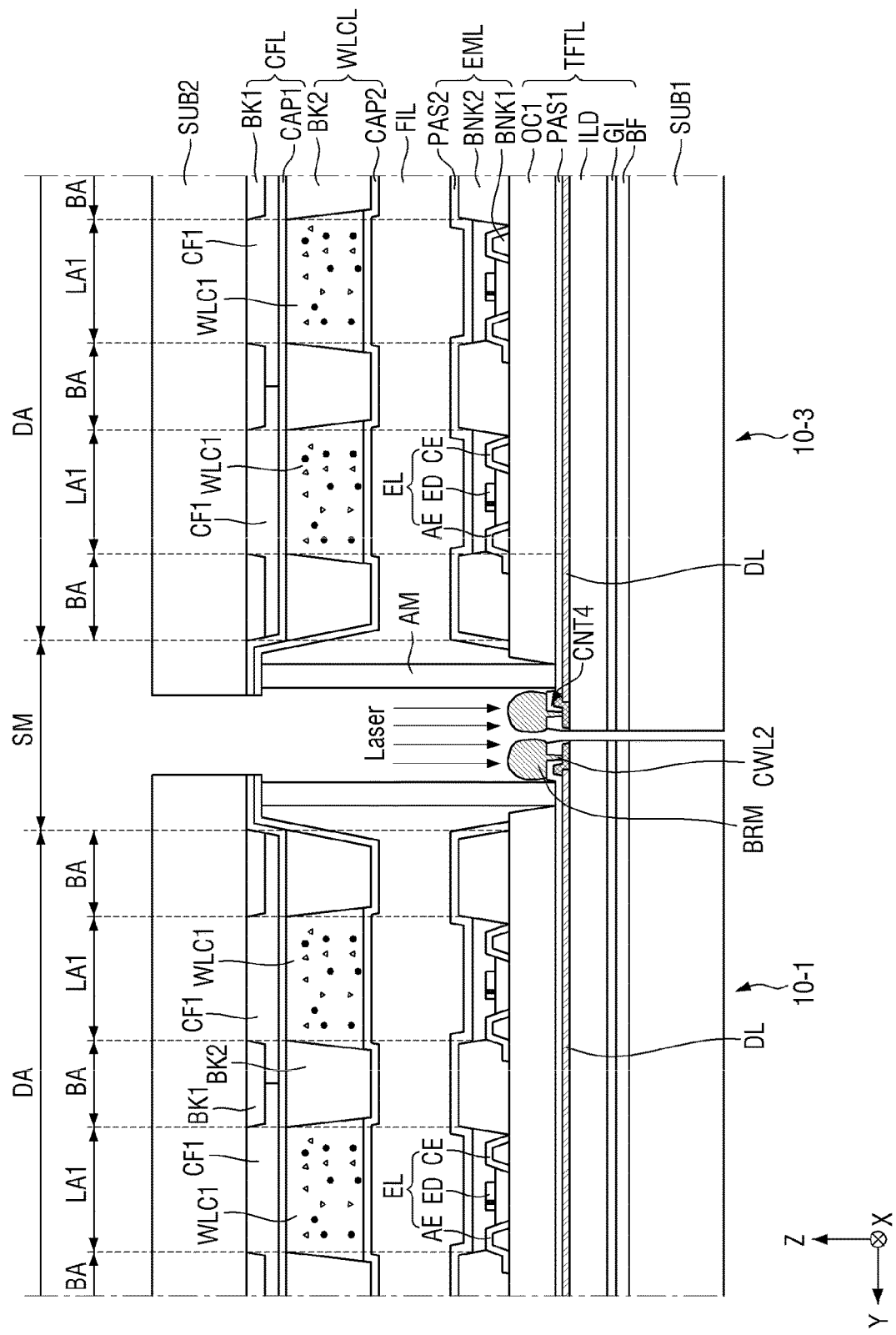
Figure 10:
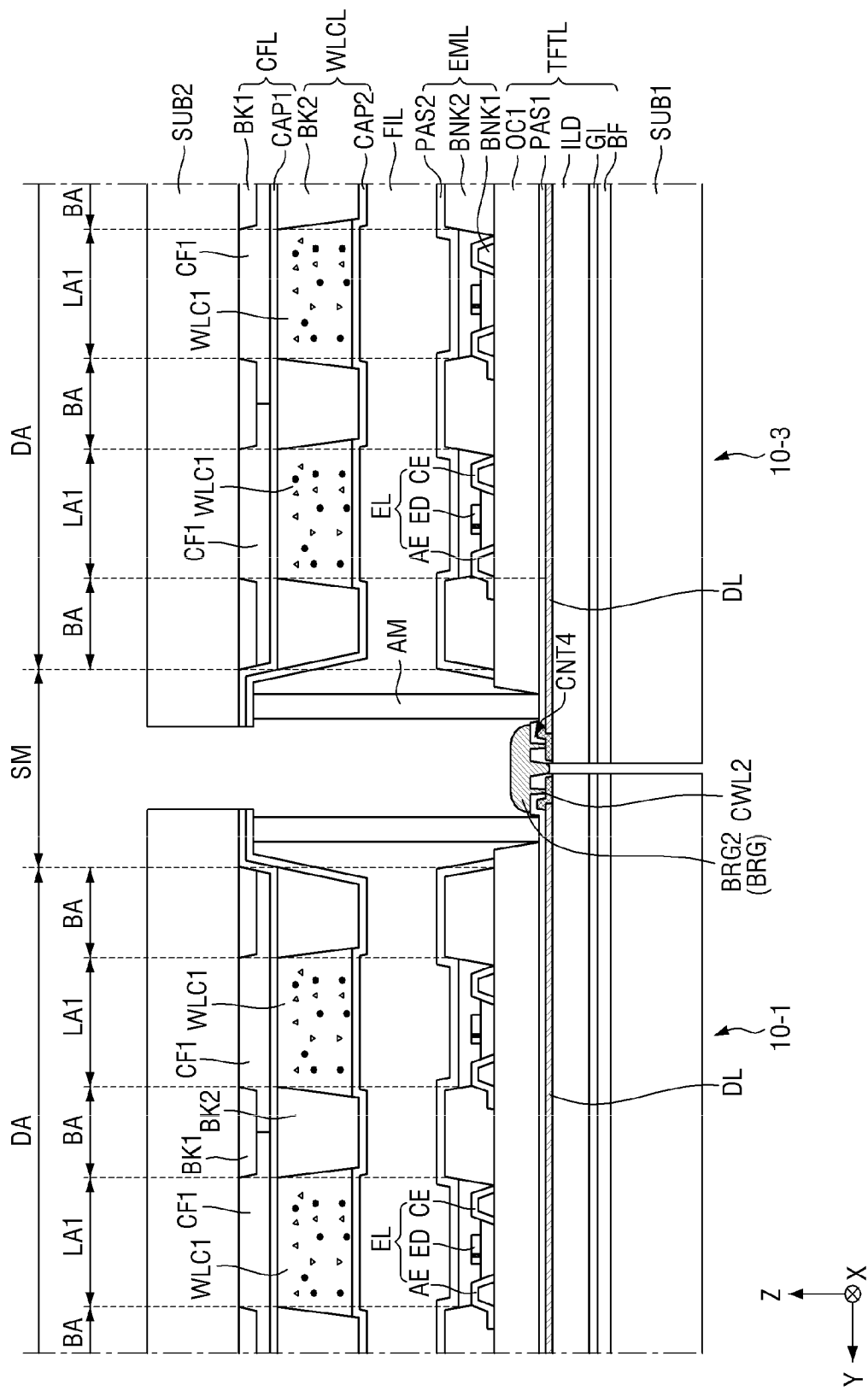

FIGS. 8 to 10 are cross-sectional views showing processes of fabricating the tiled display of FIG. 6.

The second connection line CWL2 may be on the interlayer dielectric layer ILD in the seams SM in the example shown in FIG. 8. The second connection line CWL2 may be coupled to the data line DL of the display area DA. The second connection line CWL2 may be made of the same (e.g., substantially the same) material on the same layer as the data line DL and the first and second connection electrodes CNE1 and CNE2. It is, however, to be understood that the present disclosure is not limited thereto. The second connection line CWL2 may be coupled between the data line DL and the second bridge electrode BRG2.

The first passivation layer PAS1 may cover the second connection line CWL2 and the interlayer dielectric layer ILD. The first passivation layer PAS1 may include a fourth contact hole CNT4 exposing a part of the second connection line CWL2.

The bridge electrodes BRG of the tiled display TD may be formed by using an ink ejection device IJD. The ink ejection device IJD may include an ink jet head HD and a nozzle NZ.

The inkjet head HD may be aligned above the fourth contact hole CNT4 of each of the first and third display devices 10-1 and 10-3 in the seams SM. The ink ejection device IJD may eject an ink INK containing metal particles using the nozzle NZ.

In the example shown in FIG. 9, the ejected ink INK may be inserted into the fourth contact hole CNT4 of each of the first and third display devices 10-1 and 10-3, and may be accumulated on the first protective layer PAS1 to a set or predetermined height. A material BRM forming the bridge electrodes provided in each of the first and third display devices 10-1 and 10-3 may be melted using a laser.

In FIG. 10, as the material BRM forming the bridge electrodes provided in each of the first and third display devices 10-1 and 10-3 are melted, they can be coupled with each other. Accordingly, the second bridge electrode BRG2 may couple the second connection line CWL2 of the first display device 10-1 with the second connection line CWL2 of the third display device 10-3.

Figure 11:
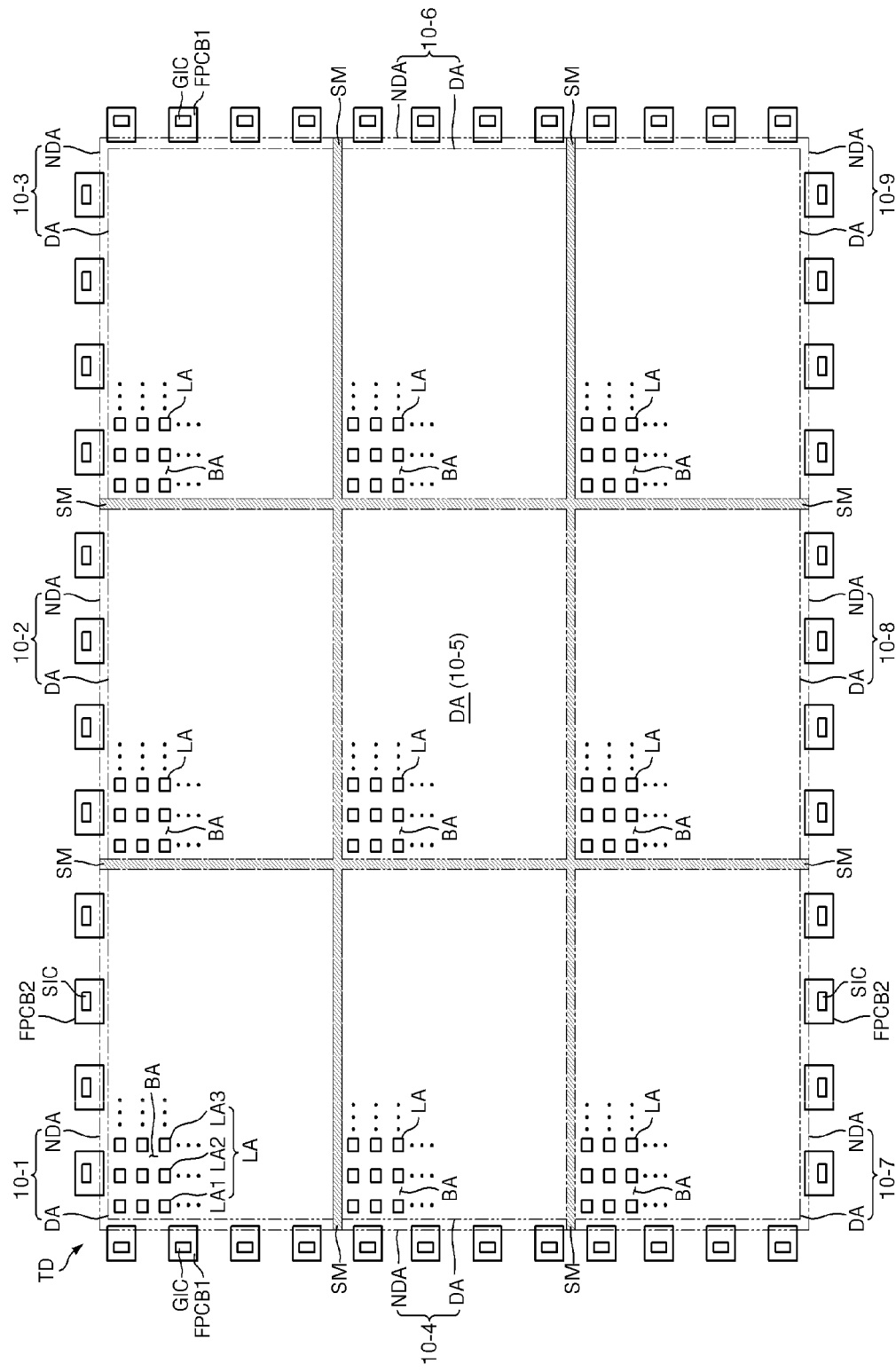
FIG. 11 is a plan view showing a tiled display according to another embodiment of the present disclosure.
Figure 12:
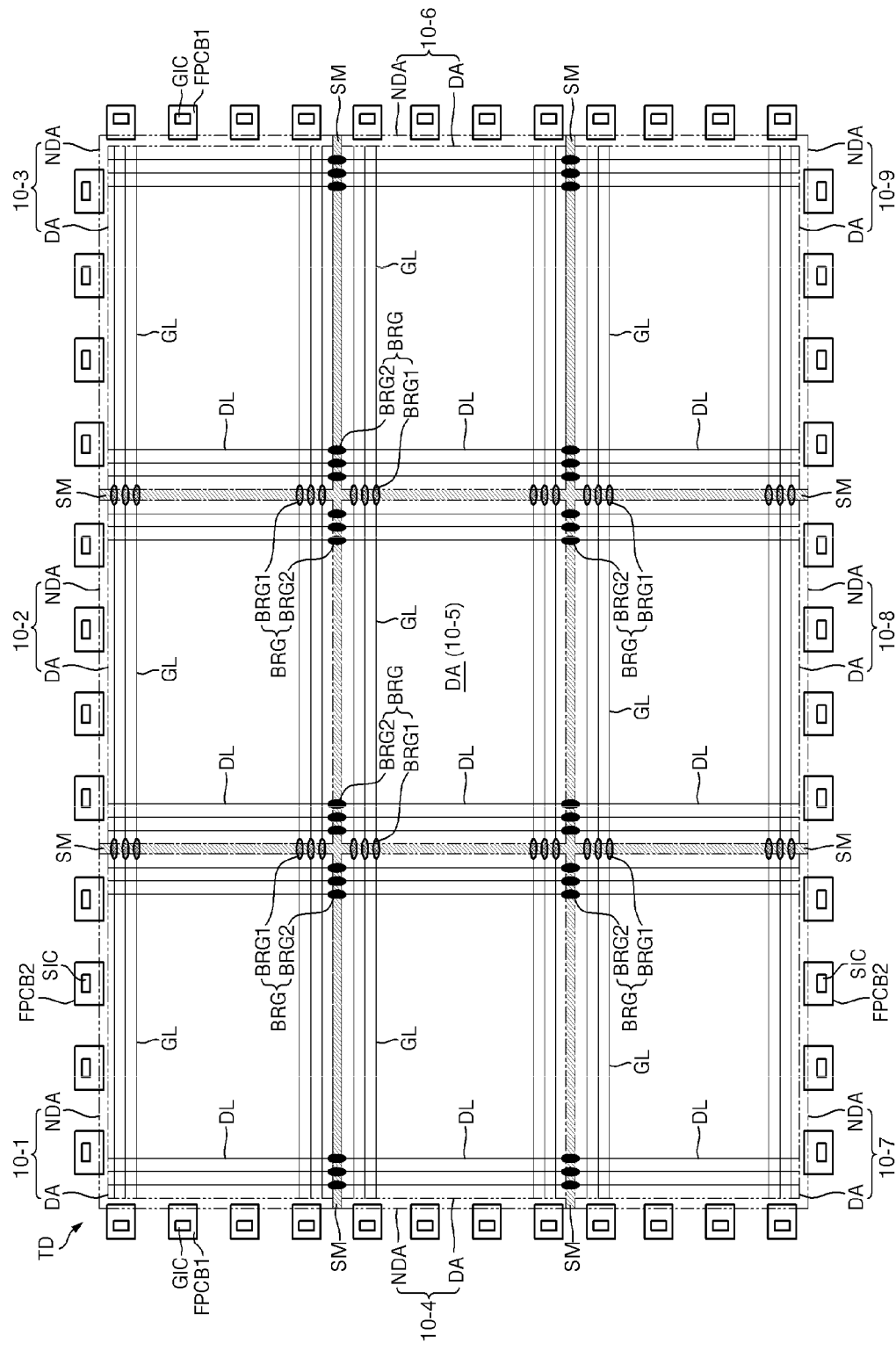
FIG. 12 is a diagram showing connection relationships between gate lines, data lines and bridge electrodes of a plurality of display devices in the tiled display according to the embodiment.

FIG. 11 is a plan view showing a tiled display according to another embodiment of the present disclosure. FIG. 12 is a diagram showing connection relationships between gate lines, data lines and bridge electrodes of a plurality of display devices in the tiled display according to the embodiment. The tiled display TD according to the embodiment of FIGS. 11 and 12 is substantially identical to the tiled display TD according to the embodiment of FIGS. 1 and 7 except for the number of a plurality of display devices 10 and connection relationships; and, therefore, redundant descriptions thereof will not be repeated here.

The tiled display TD may include first to ninth display devices 10-1 to 10-9, but the number of display devices 10 is not limited by the embodiment of FIGS. 11 and 12. The number of display devices 10 may be determined depending on the sizes of the display devices 10 and the tiled display TD.

The tiled display TD may include display areas DA of the first to ninth display device 10-1 to 10-9, and a seams SM between the display areas DA.

Some of the display devices 10 of the tiled display TD may include the gate drivers GIC, while some others of the display devices 10 may not. For example, the first, fourth and seventh display devices 10-1, 10-4 and 10-7 may include the gate drivers GIC in the non-display area NDA on the left side. The third, sixth and ninth display devices 10-3, 10-6 and 10-9 may include the gate drivers GIC in the non-display area NDA on the right side. The second, fifth and eighth display devices 10-2, 10-5 and 10-8 may include no gate driver GIC.

A gate line GL of the fourth display device 10-4 may be coupled to a gate line GL of the fifth display device 10-5 through the first bridge electrode BRG1. A gate line GL of the fifth display device 10-5 may be coupled to a gate line GL of the sixth display device 10-6 through the first bridge electrode BRG1. The fourth and sixth display devices 10-4 and 10-6 may supply a gate signal to the fifth display device 10-5 through the first bridge electrode BRG1 in the seams SM. That is to say, as the tiled display TD includes the first bridge electrodes BRG1 coupling between the first connection lines CWL1 of the adjacent display devices 10, it includes neither the first pad unit PAD1 nor the first flexible film FPCB1 in the seams SM.

Some of the display devices 10 of the tiled display TD may include the source drivers SIC, while some others of the display devices 10 may not. For example, the first to third display devices 10-1, 10-2 and 10-3 may include the source drivers SIC in the non-display area NDA on the upper side. The seventh of the ninth display devices 10-7, 10-8 and 10-9 may include the source drivers SIC in the non-display area NDA on the lower side. The fourth to sixth display devices 10-4, 10-5 and 10-6 may include no source driver SIC.

A data line DL of the second display device 10-2 may be coupled to a data line DL of the fifth display device 10-5 through the second bridge electrode BRG2. A data line DL of the fifth display device 10-5 may be coupled to a data line DL of the eighth display device 10-8 through the second bridge electrode BRG2. The second and eighth display devices 10-2 and 10-8 may supply a source voltage to the fifth display device 10-5 through the second bridge electrode BRG2 in the seams SM. That is to say, as the tiled display TD includes the second bridge electrodes BRG2 coupling between the second connection lines CWL2 of the adjacent display devices 10, it includes neither the second pad unit PAD1 nor the second flexible film FPCB2 in the seams SM.

The tiled display TD may not include the first and second pad units PAD1 and PAD2 in the seams SM, and thus the distance between the display areas DA of the display devices 10 may be so close that the seams SM are not recognized by the user. The reflectance of external light at the display areas DA of the display devices 10 may be equal to the reflectance of the external light at the seams SM. Accordingly, it is possible to prevent the seams SM of the tiled display TD from being recognized by a viewer (or to reduce visibility of the seams SM of the tiled display TD), thereby providing seamless (or substantially seamless) images between the display devices 10 and immersing a viewer in displayed images.

What is claimed is:

1. A tiled display comprising:
   a first display device comprising a first display area comprising pixels;
   a second display device comprising a second display area comprising pixels adjacent to the first display area; and
   a seam between the first display area and the second display area,
   wherein each of the first display device and the second display device comprises:
   a first base part supporting a respective one of the first display device and the second display device;
   a thin-film transistor layer on the first base part, the thin-film transistor layer comprising thin-film transistors included in the pixels and comprising connection lines in the seam; and
   bridge electrodes in the seam and inserted into a contact hole provided in the thin-film transistor layer to couple between the connection lines of the first display device and the second display device.

2. The tiled display of claim 1, wherein the first display device and the second display device further comprise gate lines and data lines respectively coupled to the pixels of the first display device and the pixels of the second display device, and
   wherein the connection lines comprise first connection lines coupled to the gate lines and second connection lines coupled to the data lines.

3. The tiled display of claim 2, wherein the bridge electrodes comprise:
   first bridge electrodes coupling between the first connection lines of the first display device and the second display device; and
   second bridge electrodes coupling between the second connection lines of the first display device and the second display device.

4. The tiled display of claim 3, wherein the thin-film transistor layer comprises:
   a buffer layer on the first base part;
   a gate insulator layer on the buffer layer;
   an interlayer dielectric layer on the gate insulator; and a passivation layer on the interlayer dielectric layer, and
wherein each of the thin-film transistors comprises:
an active area on the buffer layer;
a first electrode at one end of the active area and coupled to a respective one of the data lines through a respective one of the first connection electrodes on the interlayer dielectric layer;
a second electrode at another end of the active area opposite to the one end of the active area and coupled to a light-emitting element through a respective one of the second connection electrodes on the interlayer dielectric layer; and
a gate electrode on the gate insulator.

5. The tiled display of claim 4, wherein the first connection lines are on the gate insulator, and
wherein the first bridge electrodes are on the passivation layer and are coupled to the first connection lines through first contact holes penetrating the passivation layer and the interlayer dielectric layer.

6. The tiled display of claim 4, wherein each of the first connection lines is on the gate insulator and coupled to the gate electrode of a respective one of the thin-film transistors through a respective one of the gate lines.

7. The tiled display of claim 4, wherein the second connection lines are on the interlayer dielectric layer, and wherein the second bridge electrodes are on the passivation layer and are coupled to the second connection lines through second contact holes penetrating the passivation layer.

8. The tiled display of claim 4, wherein each of the second connection lines is on the interlayer dielectric layer and is coupled to the first electrode of a respective one of the thin-film transistors through a respective one of the data lines.

9. The tiled display of claim 4, wherein each of the first display device and the second display device further comprises a non-display area surrounding the display area,
wherein at least one selected from the first display device and second display device comprises:
a first pad connection line on the gate insulator in the non-display area;
a first pad unit on the passivation layer in the non-display area and coupled to the first pad connection line;
a first flexible film on the first pad unit; and
a gate driver on the first flexible film to supply a gate signal to the first pad unit.

10. The tiled display of claim 9, wherein the first pad connection line is coupled to the gate electrode of a respective one of the thin-film transistors through a respective one of the gate lines.

11. The tiled display of claim 4, wherein each of the first display device and the second display device further comprises a non-display area surrounding the display area,
wherein at least one of the first display device and the second display device comprises:
a second pad connection line on the interlayer dielectric layer in the non-display area;
a second pad unit on the passivation layer in the non-display area and coupled to the second pad connection line;
a second flexible film on the second pad unit; and
a source driver on the second flexible film to supply a source voltage to the second pad unit.

12. The tiled display of claim 11, wherein the second pad connection line is coupled to the first electrode of a respective one of the thin-film transistors through a respective one of the data lines.

13. The tiled display of claim 1, wherein each of the first display device and the second display device further comprises:
a light emitting element layer on the thin-film transistor layer and comprising a plurality of light emitting elements;
a wavelength conversion layer on the light emitting element layer and comprising wavelength converting units corresponding to the pixels, respectively;
a color filter layer on the wavelength conversion layer and comprising color filters corresponding to the pixels, respectively; and
a second base part on the color filter layer and facing the first base part.

14. The tiled display of claim 13, wherein each of the first display device and the second display device comprises:
a filter layer between the light emitting element layer and the wavelength conversion layer in the display area; and
a sealing member surrounding the filter layer and coupling the first base part with the second base part.

15. The tiled display of claim 14, further comprising:
a coupling member coupling a side surface of the first base part, a side surface of the thin-film transistor layer, a side surface of the sealing member and a side surface of the second base part of the first display device with corresponding ones of the second display device.

16. The tiled display of claim 15, wherein the coupling member protects the bridge electrodes and insulates adjacent bridge electrodes from each other.

17. The tiled display of claim 1, wherein the first display device comprises gate lines and data lines coupled to the pixels, gate drivers supplying gate signals to the gate lines, and a source drivers supplying source voltages to the data lines, and
wherein the second display device is adjacent to the first display device in a first direction and comprises pixels and comprises gate lines and data lines coupled to the pixels of the second display device and source drivers supplying source voltages to the data lines, and
wherein the second display device receives gate signals from the gate drivers of the first display device through the bridge electrodes.

18. The tiled display of claim 17, further comprising:
a third display device adjacent to the first display device in a second direction perpendicular to the first direction,
wherein the third display device comprises pixels and comprises gate lines and data lines coupled to the pixels of the third display device and gate drivers supplying gate signals to the gate lines, and
wherein the third display device receives source voltages from the source drivers of the first display device through the bridge electrodes.

19. The tiled display of claim 18, further comprising:
a fourth display device adjacent to the second display device in the second direction and adjacent to the third display device in the first direction,
wherein the fourth display device receives source voltages from the source drivers of the second display device through the bridge electrodes, and receives gate signals from the gate drivers of the third display device through the bridge electrodes.

20. The tiled display of claim 19, further comprising:
a fifth display device adjacent to the fourth display device in the second direction, wherein the fifth display device comprises pixels and comprises gate lines and data lines coupled to the pixels of the fifth display device and source drivers supplying source voltages to the data lines, and wherein the fourth display device receives source voltages from the source drivers of each of the second display device and the fifth display device.

\* \* \* \* \*